United States Patent
Ito et al.

(10) Patent No.: US 10,321,607 B2
(45) Date of Patent: Jun. 11, 2019

(54) RECEPTACLE ASSEMBLY AND TRANSCEIVER MODULE ASSEMBLY

(71) Applicant: YAMAICHI ELECTRONICS CO., LTD., Tokyo (JP)

(72) Inventors: Toshiyasu Ito, Tokyo (JP); Shigeru Sato, Tokyo (JP); Yosuke Takai, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 0 days.

(21) Appl. No.: 14/974,289

(22) Filed: Dec. 18, 2015

(65) Prior Publication Data
US 2016/0174415 A1    Jun. 16, 2016

Related U.S. Application Data

(63) Continuation-in-part of application No. 14/774,460, filed as application No. PCT/JP2013/067110 on Jun.
(Continued)

(51) Int. Cl.
*H05K 7/20* (2006.01)
*H05K 7/18* (2006.01)
*G02B 6/42* (2006.01)

(52) U.S. Cl.
CPC ........... *H05K 7/20445* (2013.01); *G02B 6/42* (2013.01)

(58) Field of Classification Search
CPC ............. H05K 7/20445; H05K 9/0058; H05K 7/20418; H05K 9/0016; G02B 6/4256;
(Continued)

(56) References Cited

U.S. PATENT DOCUMENTS 6,478,622 B1 * 11/2002 Hwang ............ H01R 13/65802
                                                    385/92
6,816,376 B2   11/2004 Bright et al.
(Continued)

FOREIGN PATENT DOCUMENTS

JP    2005-519452 A    6/2005
JP    2005-520296 A    7/2005
(Continued)

OTHER PUBLICATIONS

International Search Report and Written Opinion dated Aug. 6, 2013, from PCT/JP2013/067110.
(Continued)

*Primary Examiner* — James Wu
*Assistant Examiner* — Michael A Matey
(74) *Attorney, Agent, or Firm* — Katten Muchin Rosenman LLP

(57) ABSTRACT

When an optical module is inserted into a compartment of a receptacle cage in a state where a heatsink is detached from the receptacle cage, a tip end portion of a protection wall portion of the optical module comes into contact with end portions of guide pieces of a guide plate even if the optical module is inserted with the protection wall portion being lifted up, and the tip end portion of the protection wall portion is thereby pushed down and guided to a clearance below the guide pieces.

8 Claims, 25 Drawing Sheets

Related U.S. Application Data 21, 2013, now abandoned, which is a continuation of application No. PCT/JP2013/062979, filed on May 8, 2013.

(60) Provisional application No. 61/778,764, filed on Mar. 13, 2013.

(58) Field of Classification Search
CPC .... G02B 6/424; G02B 6/4269; G02B 6/4246; G02B 6/4261; G02B 6/4201; G02B 6/3893; G02B 6/387; G02B 6/3897; G02B 6/4257; G02B 27/0176; G02B 6/36
See application file for complete search history.

(56) References Cited

U.S. PATENT DOCUMENTS

| | | | | | |
|---|---|---|---|---|---|
| 7,090,523 | B2* | 8/2006 | Shirk | .................. | G02B 6/4246 439/352 |
| 7,213,980 | B2* | 5/2007 | Oki | ...................... | G02B 6/4201 385/88 |
| 7,281,862 | B2* | 10/2007 | Oen | ..................... | G02B 6/4201 385/88 |
| 7,357,582 | B2* | 4/2008 | Oki | ...................... | G02B 6/4201 385/88 |
| 7,625,223 | B1* | 12/2009 | Fogg | .................... | H05K 5/0247 361/715 |
| 7,794,241 | B2* | 9/2010 | Bright | ................. | H01R 12/721 439/59 |
| 8,770,864 | B2* | 7/2014 | Ito | ........................... | G02B 6/36 385/88 |
| 8,870,471 | B2* | 10/2014 | Ito | ........................ | G02B 6/4277 385/88 |
| 8,911,244 | B2* | 12/2014 | Elison | ................ | H05K 7/20454 439/137 |
| 9,052,483 | B2* | 6/2015 | Nguyen | ................ | G02B 6/4261 |
| 2003/0169581 | A1 | 9/2003 | Bright et al. | | |
| 2003/0171016 | A1* | 9/2003 | Bright | .................. | G02B 6/4201 439/160 |
| 2005/0100292 | A1* | 5/2005 | Malagrino, Jr. | ..... | G02B 6/4201 385/92 |
| 2006/0128221 | A1 | 6/2006 | Yoshikawa et al. | | |
| 2012/0148201 | A1 | 6/2012 | Kondou et al. | | |
| 2013/0034992 | A1* | 2/2013 | Phillips | .............. | H01R 13/6581 439/527 |
| 2014/0098497 | A1* | 4/2014 | Henry | ................. | H04L 12/6418 361/709 |
| 2016/0105991 | A1* | 4/2016 | Wanha | ...................... | G06F 1/20 165/185 |

FOREIGN PATENT DOCUMENTS

| | | |
|---|---|---|
| JP | 2006-108684 A | 4/2006 |
| JP | 2012-129287 A | 7/2012 |
| WO | 03/077375 A1 | 9/2003 |
| WO | 03/077626 A1 | 9/2003 |

OTHER PUBLICATIONS

International Preliminary Report on Patentability dated Sep. 15, 2015, from PCT/JP2013/067110.

International Search Report and Written Opinion dated Jul. 30, 2013, from PCT/JP2013/062979.

International Preliminary Report on Patentability dated Sep. 15, 2015, from PCT/JP2013/062979.

* cited by examiner

RECEPTACLE ASSEMBLY AND TRANSCEIVER MODULE ASSEMBLY

CROSS-REFERENCE TO RELATED APPLICATIONS

This application is a Continuation-in-Part application of U.S. application Ser. No. 14/774,460 filed Sep. 10, 2015. U.S. application Ser. No. 14/774,460 is a U.S. National Phase 371 Application of PCT Application No. PCT/JP2013/067110 filed Jun. 21, 2013. PCT Application No. PCT/JP2013/067110 claims the benefit of U.S. Provisional Patent Application No. 61/778,764 filed on Mar. 13, 2013, and PCT/JP2013/067110 is a Continuation of PCT Application No. PCT/JP2013/062979 filed on May 8, 2013, which are hereby incorporated by reference wherein in their entirety.

BACKGROUND OF THE INVENTION

Field of the Invention

The present invention relates to a receptacle assembly provided with a heatsink, and to a transceiver module assembly.

Description of the Related Art

A transceiver module is in practical use in an optical communication system for transmitting an optical signal, which is transmitted by an optical connector and the like, to a mother board. As shown in Japanese Patent Application Laid-Open No. 2005-520296, for example, a transceiver module is disposed on a chassis constituting a communication system. The transceiver module comprises, as its main constituents; an optical module (which is referred to as a module assembly in Japanese Patent Application Laid-Open No. 2005-520296); and an optical module receptacle (which is referred to as a receptacle assembly in Japanese Patent Application Laid-Open No. 2005-520296) provided on a circuit board as a mother board and configured to detachably accommodate the optical module.

On a front face cover of the above-mentioned chassis, a plurality of optical modules may be arranged at predetermined intervals and in parallel with one another in one direction. For example, an optical cable connector and an optical cable, which are used to establish interconnection to another system, are connected to a port at an end portion of each optical module exposed to the front face cover of the chassis. When each optical module is connected to the optical module receptacle, a connection end portion of the optical module is connected to a portion to be connected of a receptacle connector mounted on a circuit board in the optical module receptacle. The portion to be connected of the receptacle connector is electrically connected to the above-mentioned circuit board. Hereby, the optical cable connector and the optical cable are electrically connected to the circuit board via the transceiver module.

In addition, a heatsink for dissipating heat generated from the optical module to the inside of the chassis is provided at an upper end portion of a cage (which is referred to as a guide frame in Japanese Patent Application Laid-Open No. 2005-520296) of the optical module receptacle as shown in FIG. 9. As shown in FIG. 2, a lower end surface of the heatsink is provided with a protruding heat transfer surface portion, with which an outer peripheral surface of the optical module comes into contact via an opening of the cage when the optical module is connected to the optical module receptacle. A peripheral edge of the heat transfer surface portion of the heatsink is received by a frame portion formed on a peripheral edge of the opening that is formed in an upper end surface of the cage, and is retained on the cage by use of a clip. In such cases, two side portions of the clip are engaged with retention tabs, respectively, which are formed on both side walls of the cage.

SUMMARY OF THE INVENTION

The area of the heat transfer surface portion of the heatsink described above is requested to be large from the viewpoint of heat dissipation efficiency.

However, as shown in Japanese Patent Application Laid-Open No. 2005-520296, a predetermined bending margin of the frame portion is required in the cage, which is formed by sheet-metal working when the cage is configured such that the heatsink is received by the frame portion formed on a peripheral edge of the opening to be formed in the upper end surface of the cage. Accordingly, there is a limitation in increasing the opening area of the opening through which the heat transfer surface portion of the heatsink passes.

In addition, in the case where the heatsink is not disposed in the cage, the outer peripheral surface of the optical module inserted into the cage is not guided by the heat transfer surface portion of the heatsink and the inserted optical module may not be located at an appropriate position by a clearance between an outer peripheral portion of the optical module and the cage when the optical module is connected to the optical module receptacle. As a consequence, the connection end portion of the optical module may not be smoothly connected to the portion to be connected of the receptacle connector.

In view of the above-described problems, the present invention aims to provide a receptacle assembly provided with a heatsink, and a transceiver module assembly. The heatsink, and the transceiver module assembly can set the area of a heat transfer surface portion of a heatsink at a maximum with respect to an optical module accommodating portion of an optical module receptacle, and also smoothly connect a connection end portion of an optical module to a portion to be connected of a receptacle connector even when the heatsink is not disposed in a cage.

To achieve the object described above, a receptacle assembly provided with a heatsink, according to the present invention, comprises a receptacle cage including at least one module accommodating portion provided with at least one module slot located on one end of the module accommodating portion and the module slot configured to allow passage of an optical module, the optical module having a module board provided with a connection end portion at one end portion of the module board, the module accommodating portion configured to detachably accommodate the optical module, and having a bottom wall portion to come into contact with a lower surface of the optical module, and at least one connector accommodating portion communicating with the module accommodating portion and configured to accommodate a connector to which the connection end portion of the module board is detachably connected; a heatsink selectively placed on the receptacle cage and configured to dissipate heat generated from the optical module by coming into contact with an outer peripheral portion of the optical module via a heat transfer surface having an area corresponding to an area of the bottom wall portion; a heatsink support mechanism provided at the receptacle cage and configured to support the heatsink slidably along a direction of attachment and detachment of the optical module when the heatsink is placed on the receptacle cage; and a guide plate member provided at the receptacle cage and configured, when the heatsink is not disposed, to come into contact with a tip end portion of an outer shell portion which projects toward the connector more than the connection end portion of the optical module and thus to guide the tip end portion into the connector accommodating portion, in such a way as to direct a tip end portion of the connection end portion of the optical module, being inserted through the module slot, to the connector.

In addition, the guide plate member may have a notch portion located at a position above the connector accommodating portion, and the heat transfer surface of the heatsink may have an extension portion to be inserted into the notch portion. The guide plate member may be fixed to a side wall of the receptacle cage. A clearance may be formed between an inner peripheral surface of the guide plate member and an outer peripheral surface of a connector cover covering the connector, in such a way as to allow insertion of a protection wall of the optical module configured to protect the connection end portion. The guide plate member may be provided at a lower position than a position of the heatsink support mechanism in the receptacle cage. A width of the notch portion of the guide plate member in a direction orthogonal to the direction of attachment and detachment of the optical module may be smaller than a width, being orthogonal to the direction of attachment and detachment, of a protection wall of the optical module. When the heatsink is placed on the receptacle cage, an end portion of the heatsink may be fixed with the guide plate member in a state of being biased by an elastic member of the heatsink support mechanism.

A transceiver module assembly according to the present invention comprises: an optical module including a module board provided with a connection end portion at one end portion of the module board; and the receptacle assembly described above.

According to the receptacle assembly provided with a heatsink and the transceiver module assembly of the present invention, the heatsink support mechanism provided to the receptacle cage supports the heatsink slidably along the direction of attachment and detachment of the optical module when the heatsink is placed in the receptacle cage. Thus, it is possible to set the area of a heat transfer surface portion of the heatsink at a maximum with respect to an optical module accommodating portion of an optical module receptacle. In addition, when the heatsink is not disposed therein, the guide plate member provided at the receptacle cage is brought into contact with the tip end portion of an outer shell portion, which projects toward a connector more than a connection end portion of the optical modules, and the guide plate member thus guides the tip end portion into a connector accommodating portion in such a way that a tip end portion of the connection end portion of the optical module inserted through a module slot is guided to the connector. Accordingly, it is possible to smoothly connect a connection end portion of the optical module to a portion to be connected of the receptacle connector even when the heatsink is not placed on the cage.

Further features of the present invention will become apparent from the following description of exemplary embodiments (with reference to the attached drawings).

DESCRIPTION OF THE EMBODIMENTS

Figure 2:
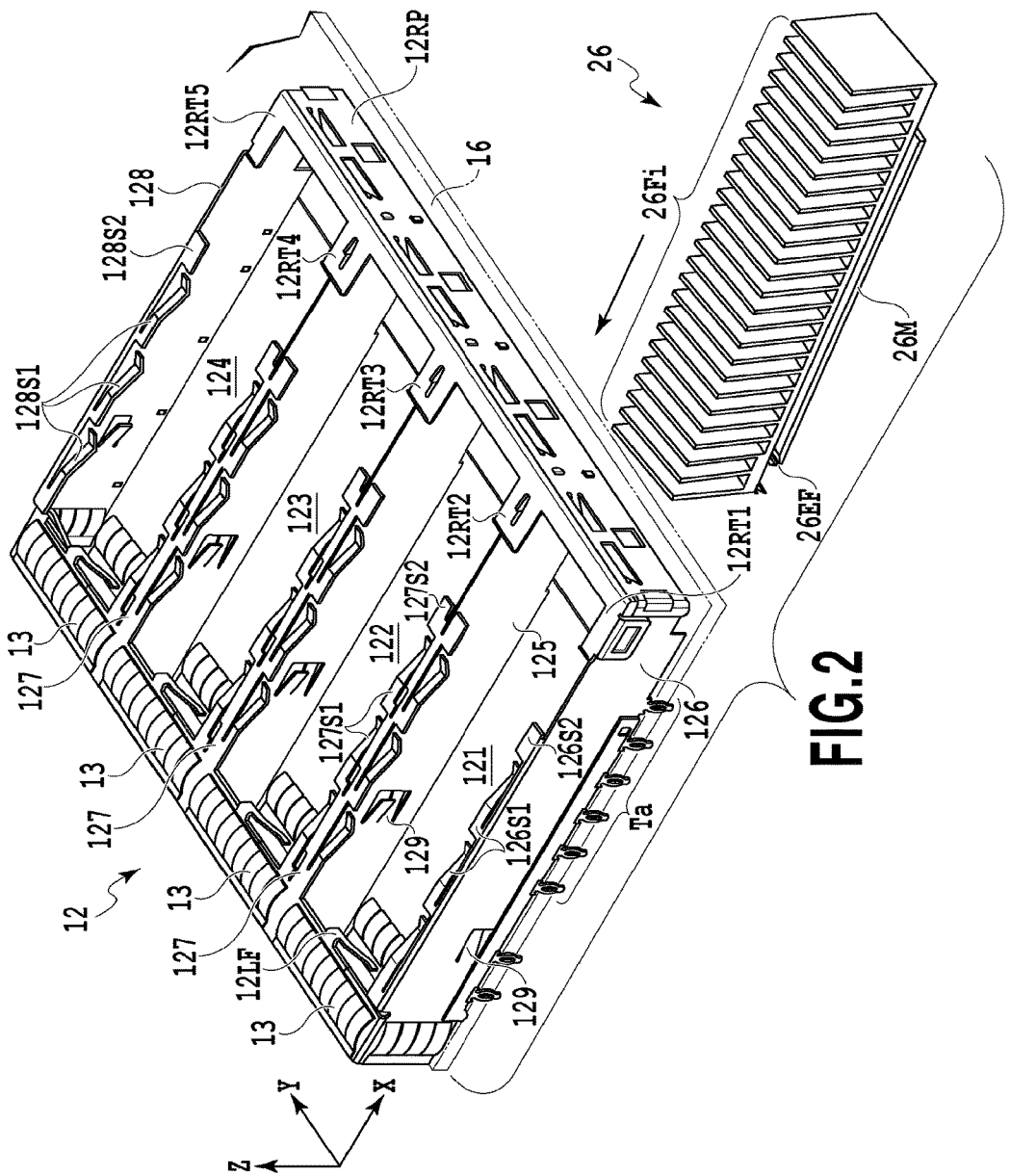
FIG. 2 is a perspective view showing the first embodiment of the receptacle assembly according to the present invention together with a heatsink.

FIG. 2 shows a first embodiment of a receptacle assembly constituting part of a transceiver module assembly according to the present invention, together with a printed wiring board disposed inside a given casing. Note that FIG. 2 illustrates a state where an optical module 14 and a heatsink 26 to be described later are detached therefrom.

A printed wiring board 16 on which a transceiver module assembly is mounted is accommodated in the casing (not shown) that forms an enclosed space inside. Here, four receptacle cages are mounted on the single printed wiring board 16 in FIG. 2. However, the present invention is not limited to this example, and five or more receptacle cages may be mounted on the single printed wiring board 16.

The transceiver module assembly comprises the optical module 14 and an optical module receptacle assembly.

The optical module 14 comprises, as its main constituents, an upper case as well as a lower plate which are made of metal and form an outer shell portion, and a module board to be located at a predetermined position in a housing space formed between the upper case and the lower plate.

Figure 4:
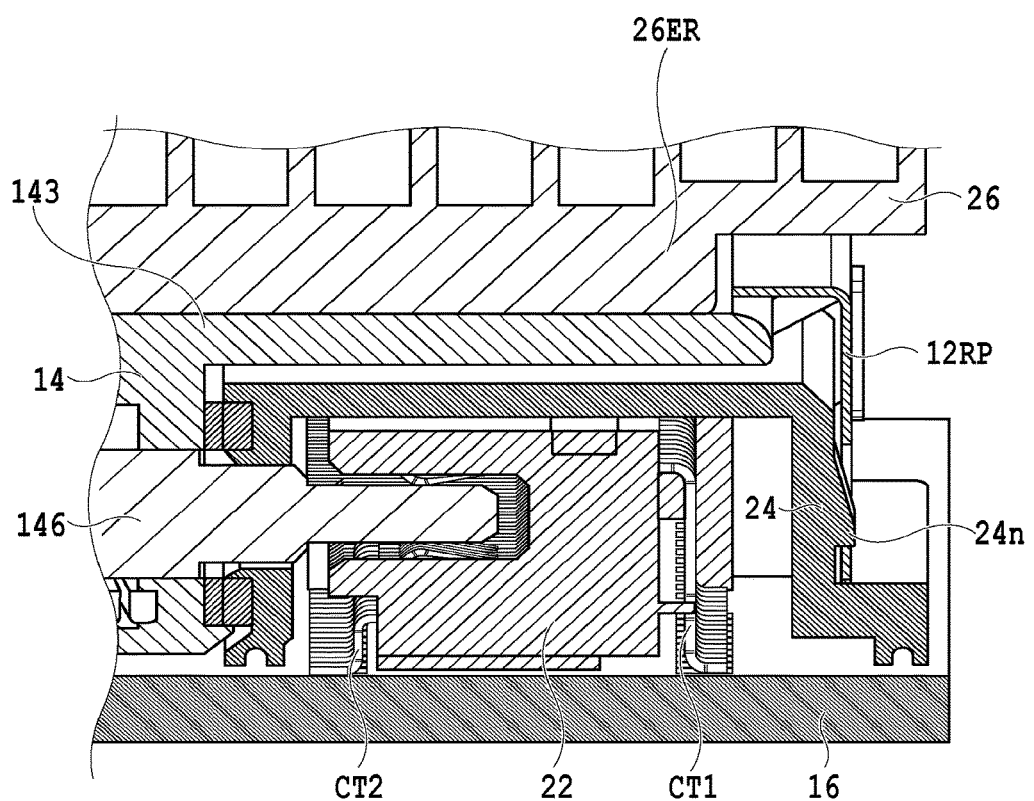
FIG. 4 is a enlarged partial cross-sectional view showing substantial part of the example illustrated in FIG. 2 in a state where the heatsink is attached.
Figure 6:
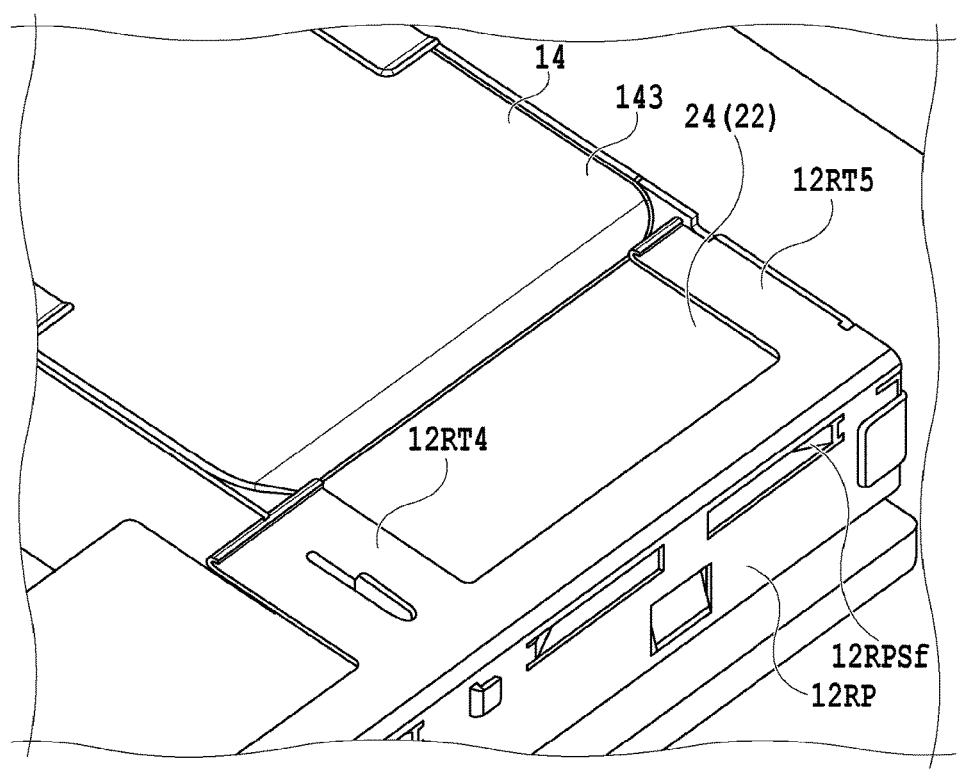
FIG. 6 is a partial perspective view made available for explanation of an operation in the example illustrated in FIG. 2.

The upper case as an upper member has a lower end that is opened. As shown in FIG. 4, a protection wall 143 in a shape of a thin plate, which is continuous with an upper surface and two side surfaces of the upper case and projects in a longitudinal direction, is formed in a gantry shape at one end portion of the upper case. As shown in a partially enlarged manner in FIG. 4 and FIG. 6, a tip end portion of the protection wall 143 has an arc portion which is rounded in a thickness direction. Note that the tip end portion of the protection wall 143 is not limited to this example, but may be provided with an inclined surface portion formed by chamfering and thus directed obliquely downward to the right in FIG. 4, for instance. The protection wall 143 is provided in order to protect a plug connector 146 to be described later in case of dropping the optical module 14 by mistake. A latch mechanism (not shown) is provided at another end portion of the upper case. The latch mechanism comprises a release plate and a latch lever. When the latch lever (not shown) is turned in one direction, a locking piece of the release plate is moved and detached from a lock piece 129 (see FIG. 2) to be described later, thereby establishing an unlocked state. On the other hand, when the latch lever is turned in the other direction, the locking piece of the release plate is locked with the lock piece 129 of a receptacle cage 12 to be described later. Thus, the optical module 14 is set to a state locked with the receptacle cage 12.

The module board has an electrode unit provided at one end portion thereof and constituting the plug connector 146 as a connection end portion. On a top surface and a bottom surface of the electrode unit formed at a tip end portion of the plug connector 146, a plurality of contact pads are arranged on common planes, respectively, at predetermined intervals and in parallel with one another.

The plate-shaped lower plate as a lower member is fixed to a lower end of the upper case with small screws in such a way as to cover the opening at the lower end of the upper case described above.

An optical connector connected to one end of an optical cable (not shown) is connected to a port provided at an end portion of the optical module 14. The other end of the optical cable is connected to an optical connector of another casing that constitutes a not-illustrated communication system, for example.

Here, the above-described module board is provided with the plug connector 146 as the connection end portion. However, the present invention is not limited to this example. For instance, the module board may have a card edge terminal as the connection end portion at the tip end portion instead of the plug connector.

As shown in FIG. 2, the optical module receptacle assembly comprises, as its main constituents: the receptacle cages 12 each provided on the printed wiring board 16 and detachably housing the above-described optical module 14; receptacle connectors 22 accommodated respectively in receptacle connector accommodating portions of the receptacle cages 12; and a cover 24 including a plurality of connector accommodating portions to separately accommodate the respective receptacle connectors 22.

As shown in FIG. 2, each receptacle cage 12 is made of a thin plate of stainless steel or phosphor bronze, for example, and is preferably formed by press working of stainless steel or phosphor bronze having high thermal conductivity. Compartments 121, 122, 123, and 124, each of which is formed from a module accommodating portion and the receptacle connector accommodating portion, are provided inside the receptacle cages 12. The compartments 121, 122, 123, and 124 are arranged in parallel along a Y coordinate axis of the Cartesian coordinates in FIG. 2, which extends in a direction orthogonal to a direction of attachment and detachment of the optical module 14. Since the compartments 121, 122, 123, and 124 have the same structure, the compartment 121 will be described below while omitting explanation of the rest of the compartments 122, 123, and 124.

The module accommodating portion of the compartment 121 is formed by being surrounded by a side wall 126 and a partition wall 125 opposed to each other with a predetermined interval in between, as well as a bottom wall portion 12BP of the module accommodating portion. The side wall 126 and the partition wall 125 extend in an X coordinate axis in FIG. 2, i.e., along the direction of attachment and detachment of the optical module 14. Each of the side wall 126 and the partition wall 125 is provided with the lock piece 129 located in the vicinity of a module slot to be described later. The lock pieces 129 on the side wall 126 and the partition wall 125 are opposed to each other. Each lock piece 129 is selectively engaged with the locking piece of the release plate of the optical module 14 so as to establish the locked state of the above-described optical module 14 with the module accommodating portion.

The module accommodating portion has the module slot on one end, which is opened in the direction of the X coordinate axis. Accordingly, the optical module 14 is attached and detached via the module slot. Tubular front EMI fingers 13 are provided at the entire periphery of the module slot having a substantially rectangular cross section. Moreover, additional front EMI fingers (not shown) are provided to the partition wall 125 as well. The front EMI fingers 13 and the additional front EMI fingers constitute a shield member. An inner peripheral portion of each front EMI finger 13 comes into contact with an outer peripheral portion of the inserted optical module 14. In addition, an outer peripheral portion of each front EMI finger 13 comes into contact with a peripheral edge of the opening of the casing described above, for example.

Accordingly, when the receptacle cage 12 is press-fitted into the opening of the casing, a gap between the opening of the casing and an outer peripheral portion of the receptacle cage 12 is shielded with the shield member including the front EMI fingers 13 made of a metal. Thus, noise is confined in the above-described casing, and there is no risk of leakage of the noise to the outside through a gap between the outer peripheral portion of the optical module 14 and an inner peripheral portion of the module accommodating portion.

In the meantime, the other end of the module accommodating portion opposite from the module slot communicates with the inside of the receptacle connector accommodating portion. An opening opened along a Z coordinate axis in FIG. 2 is formed at a portion of the receptacle cage 12 opposite from the bottom wall portion 12BP. A heatsink support mechanism which detachably supports the heatsink 26 to be described later is provided on a peripheral edge of the opening. Here, the heatsink support mechanism which detachably supports the heatsink 26 is also provided to each of the compartments 122, 123, and 124. Accordingly, the respective heatsinks 26 are selectively disposed on the receptacle cages 12 via the heatsink support mechanisms in such a way as to block the above-mentioned openings of the compartments 121, 122, 123, and 124.

Figure 3:
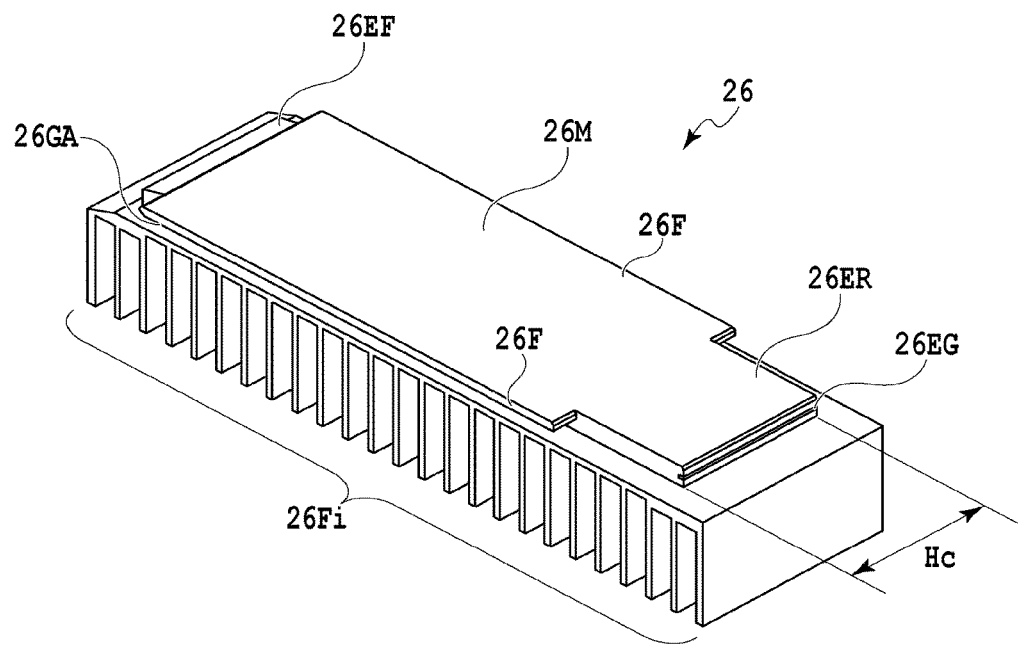
FIG. 3 is a perspective view showing the heatsink used in the example illustrated in FIG. 2.

Each heatsink 26 is made of a metal having high thermal conductivity such as aluminum. The heatsink 26 has a plurality of fins 26Fi (i=1 to n, n is a positive integer) which are arranged in parallel with one another and at predetermined intervals along the X coordinate axis. The plurality of fins 26Fi are formed substantially perpendicular to a flat surface of a base portion 26M to be supported by the heatsink support mechanism. As shown in the enlarged view of FIG. 3, a pair of flange portions 26F are formed opposite to each other at a predetermined length on two side portions of the base portion 26M, respectively. An elongated groove 26GA is formed between each flange portion 26F and a junction where lower end portions of the plurality of fins 26Fi are joined together. The elongated groove 26GA is slidably engaged with: a flexural piece 126S2 and three pressing springs 126S1 which are formed at an upper end portion of the side wall 126; and a flexural piece 127S2 and three pressing springs 127S1 of a top plate 127 provided at an upper end of the partition wall 125. As shown in the enlarged view of FIG. 3, a pressing end portion 26EF is formed at one end in a longitudinal direction of the base portion 26M. The pressing end portion 26EF has a smaller width than a width of a central part of the base portion 26M and comes into contact with a return plate spring 12LF to be described later. In addition, an extension portion 26ER is formed at the other end in the longitudinal direction of the base portion 26M. The extension portion 26ER has a smaller width Hc than the width of the central part of the base portion 26M and extends from end portions of the flange portions 26F in the longitudinal direction of the base portion 26M. The width Hc is set slightly smaller than a distance Lc (see FIG. 1) between guide pieces of a guide plate 12RP to be described later. A groove 26EG, which is locked with a fixing portion of the guide plate 12RP to be described later at the time of attachment of the heatsink 26, is formed on an end surface of the extension portion 26ER. When the optical module 14 is attached to the inside of the receptacle cage 12, a heat transfer surface of the base portion 26M inclusive of the extension portion 26ER comes into contact with an upper plate of the optical module 14 and a surface of the protection wall portion 143 as shown in FIG. 4. As a consequence, heat from the optical module 14 is dissipated via the heatsink 26. In this case, a heat transfer area is expanded more by bringing the heat transfer surface of the extension portion 26ER into contact with the surface of the protection wall portion 143. Thus, the optical module 14 can be cooled more efficiently. In addition, strength of the heatsink 26 is improved by the extension portion 26ER.

As shown in FIG. 2, the above-mentioned heatsink support mechanism comprises: the flexural piece 126S2 and the three pressing springs 126S1 formed at a flexural portion provided at an uppermost end of the side wall 126 constituting the receptacle cage 12; the flexural piece 127S2 and the three pressing springs 127S1 formed at the top plate 127 provided at the upper end of each of the partition walls 125; and a flexural piece 128S2 and three pressing springs 128S1 formed at a flexural portion provided at an uppermost end of a side wall 128.

As heatsink fixing means, the guide plate 12RP provided at a back surface portion of the receptacle cage 12, and the plate springs 12LF each of which biases the grooves 26EG of the extension portion 26ER of the corresponding heatsink 26 toward the corresponding fixing portion of the guide plate 12RP are provided in the receptacle cage 12.

The pressing springs 126S1 as well as the flexural piece 126S2 of the side wall 126 and the top plate 127 provided at the upper end of the partition wall 125 are formed on a common plane in such a way as to face one another with a predetermined interval in between. Ends on one side of the side walls 126 and 128 and ends on one side of the respective partition walls 125 are connected to one another by the guide plate 12RP which extends along the Y coordinate axis in FIG. 2.

The guide plate 12RP comprises: a cover fixation unit coming into contact with the ends on the one side of the side walls 126 and 128 as well as the ends on the one side of the respective partition walls 125 and constituting the back surface portion of the receptacle cage 12; and guide pieces 12RT1, 12RT2, 12RT3, 12RT4, and 12RT5 formed continuously with an upper end portion of the cover fixation unit.

Figure 5:
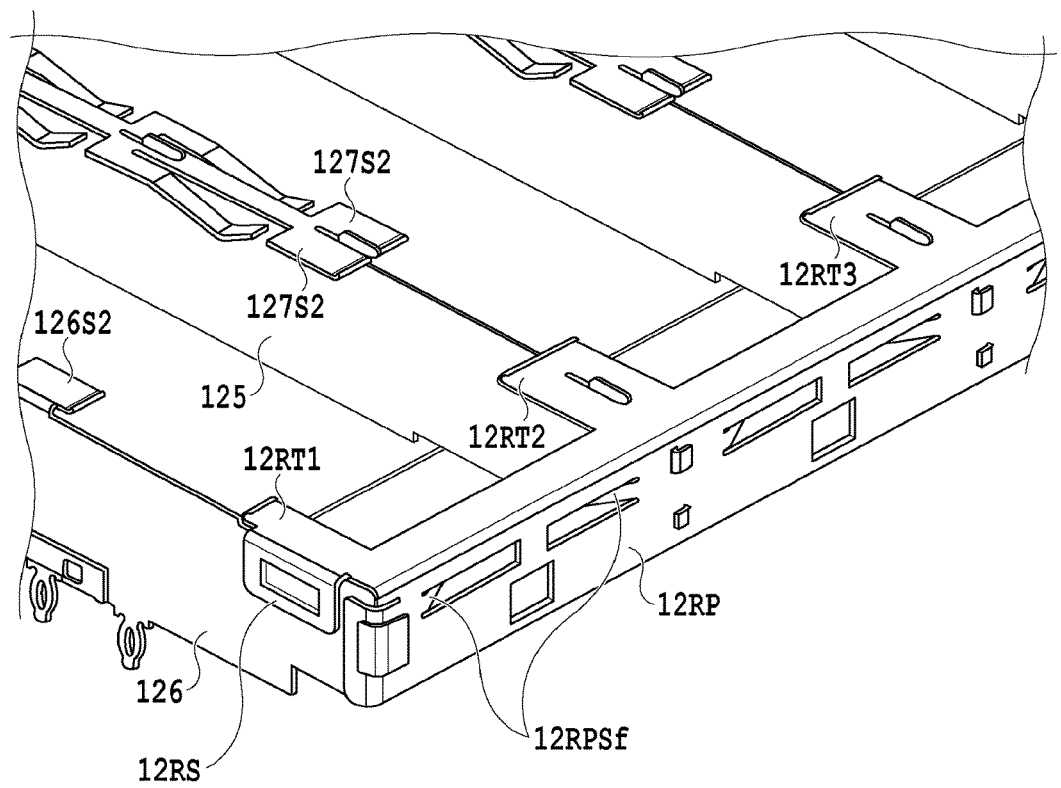
FIG. 5 is a enlarged partial perspective view showing part of the example illustrated in FIG. 2.

Two ends in a longitudinal direction of the cover fixation unit are locked with outer peripheral portions of the side walls 126 and 128, respectively. As shown in the enlarged view of FIG. 5, pairs of ejection plate springs 12RPSf are formed on a common straight line at the cover fixation unit. The pairs of the ejection plate springs 12RPSf are formed corresponding to the compartments 121, 122, 123, and 124, respectively. A rectangular opening, into which a claw portion of the cover 24 to be described later is inserted, is formed at a position below each pair of the ejection plate springs 12RPSf. In this way, the cover 24 is fixed to the guide plate 12RP. Each pair of ejection plate springs 12RPSf are configured to bias the protection wall portion 143 of each attached optical module 14 in such a way as to push outward just in a predetermined amount from the receptacle cage 12 through the module slot.

Figure 1:
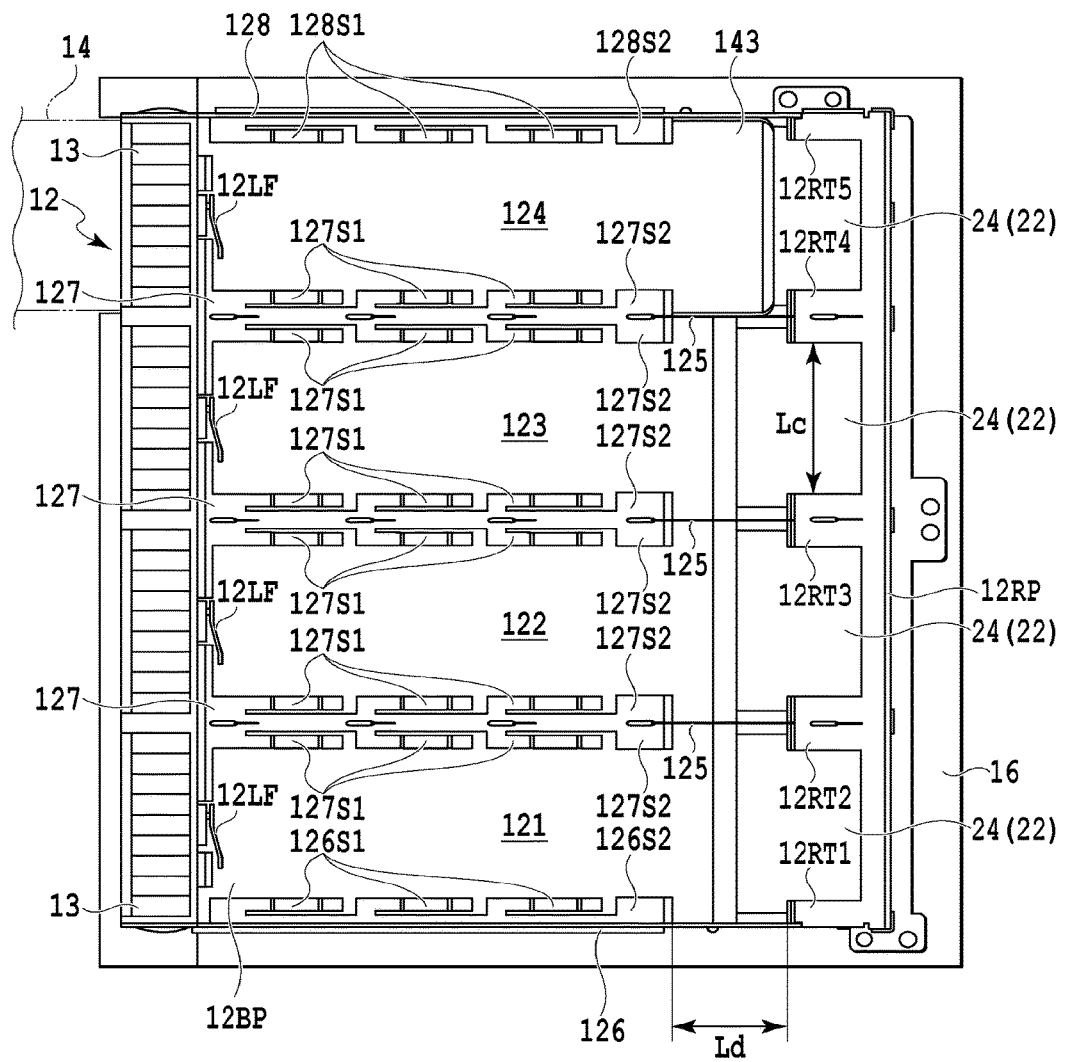
FIG. 1 is a plan view showing a first embodiment of a receptacle assembly according to the present invention.

As shown in FIG. 1, the guide pieces 12RT1, 12RT2, 12RT3, 12RT4, and 12RT5 are placed on and locked with upper parts of the ends on the one side of the side walls 126 and 128 and upper parts of the ends on the one side of the respective partition walls 125. The guide pieces 12RT1, 12RT2, 12RT3, 12RT4, and 12RT5 are formed in parallel with one another, and extend at a predetermined distance toward the flexural pieces 126S2, 127S2, and 128S2, respectively. As shown in FIG. 1, tip end portions of the guide pieces 12RT1, 12RT2, 12RT3, 12RT4, and 12RT5 are formed at such positions away from end portions of the flexural piece 126S2, the flexural pieces 127S2, and the flexural piece 128S2 by a predetermined distance Ld, respectively. Thus, as shown in the enlarged view of FIG. 2, the flexural piece 126S2, the flexural pieces 127S7, and the flexural piece 128S2 can easily be inserted into the elongated grooves 26GA of the heatsinks 26, respectively, in the state where the pressing end portions 26EF are tilted obliquely downward to the left toward the inside of the module accommodating portions.

Ends of the guide piece 12RT1 and the guide piece 12RT2 are connected to each other in a mutually opposed manner while providing the interval of the predetermined distance Lc in between, and so are ends of the guide piece 12RT2 and the guide piece 12RT3, ends of the guide piece 12RT3 and the guide piece 12RT4, and ends of the guide piece 12RT4 and the guide piece 12RT5, respectively. The predetermined distance Ls is set slightly smaller than the width of the protection wall portion 143 of the optical module 14. Thus, a notch portion is formed between each pair of the guide pieces. In the meantime, the guide piece 12RT2, the guide piece 12RT3, and the guide piece 12RT4 project into the adjacent compartments, respectively.

The extension portions 26ER of the heatsinks 26 described above are inserted between the guide piece 12RT1 and the guide piece 12RT2, between the guide piece 12RT2 and the guide piece 12RT3, between the guide piece 12RT3 and the guide piece 12RT4, and between the guide piece 12RT4 and the guide piece 12RT5. Portions between the ends of the guide piece 12RT1 and the guide piece 12RT2, between the ends of the guide piece 12RT2 and the guide piece 12RT3, between the ends of the guide piece 12RT3 and the guide piece 12RT4, and the ends of the guide piece 12RT4 and the guide piece 12RT5 are formed as the fixing portions, with which the grooves 26EG of the extension portions 26ER of the heatsinks 26 described above are locked, respectively.

A flexural portion 12RS formed integrally with the guide piece 12RT1, and a flexural portion (not shown) formed integrally with the guide piece 12RT5 are locked with the outer peripheral portions of the side walls 126 and 128, respectively.

Figure 7A:
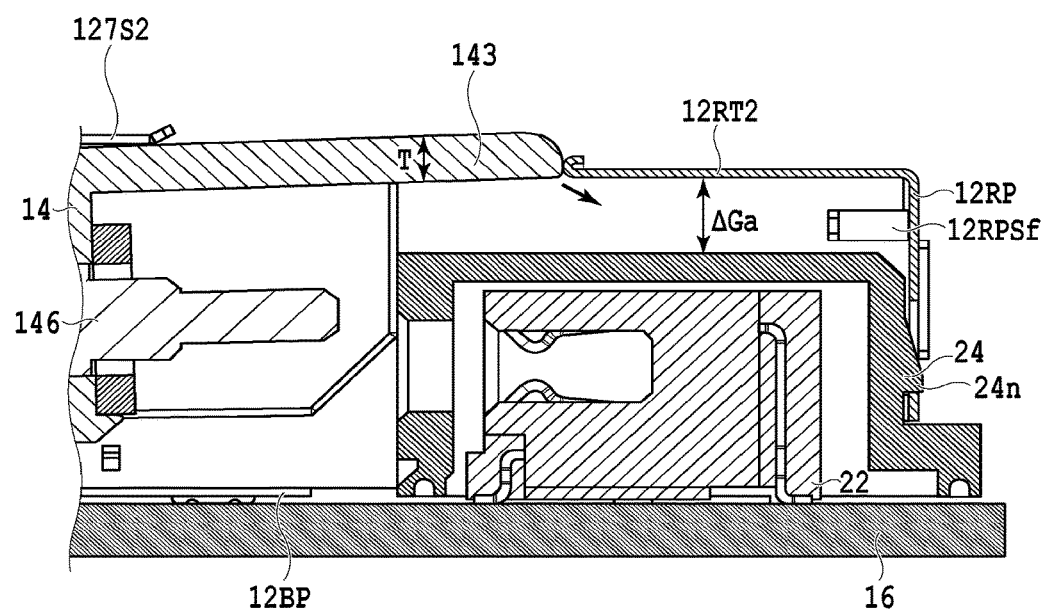
FIG. 7A is a partial cross-sectional view made available for the explanation of the operation in the example illustrated in FIG. 2.
Figure 7B:
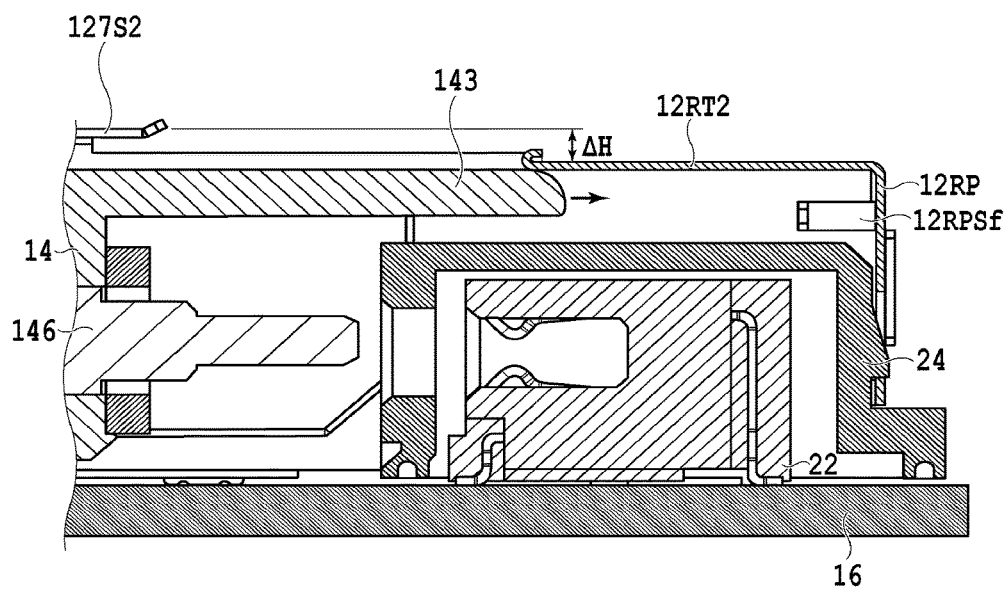
FIG. 7B is a partial cross-sectional view made available for the explanation of the operation in the example illustrated in FIG. 2.

As shown in FIG. 7A and FIG. 7B, a position of each of the guide pieces 12RT1, 12RT2, 12RT3, 12RT4, and 12RT5 is set to such a position lower by a predetermined dimension ΔH than a position of the corresponding top plate 127. In addition, a distance ΔGa between an inner peripheral portion of each of the guide pieces 12RT1, 12RT2, 12RT3, 12RT4, and 12RT5 and an upper surface of an outer peripheral portion of the cover 24 is set larger than a thickness T of the protection wall portion 143 of the optical module 14. In addition, the distance ΔGa is set such that a clearance between an upper surface of the protection wall 143 and an inner peripheral surface of the guide piece 12RT1 becomes larger than a clearance between a slit of the cover 24 and the plug connector 146 when the protection wall 143 is inserted between the guide piece 12RT1 and the upper surface of the outer peripheral portion of the cover 24.

As shown in FIG. 1 and FIG. 2, the pressing springs 126S1 to bias one of the flange portions 26F of the heatsink 26 downward are formed at three positions at predetermined intervals on a common straight line at the flexural portion of the side wall 126. A base end of each pressing spring 126S1 is formed integrally with the flexural portion of the side wall 126. A tail end of each pressing spring 126S1 extends toward the flexural piece 126S2 and has a folded portion which is elastically deformable along the Z coordinate axis. The folded portion has a curvature corresponding to a height of each elongated groove 26GA of the heatsink 26.

The pressing springs 127S1 to bias the other flange portion 26F of the heatsink 26 are formed at three positions at predetermined intervals on a common straight line at each top plate 127 as well. A base end of each pressing spring 127S1 is formed integrally with the top plate 127. A tail end of each pressing spring 127S1 extends toward the flexural piece 127S2 and has a folded portion which is elastically deformable along the Z coordinate axis. The folded portion has the curvature corresponding to the height of each elongated groove 26GA of the heatsink 26. Thus, if the heatsink 26 is not attached, the optical module 14 does not interfere with the pressing springs 126S1 or the pressing springs 127S1 and the folded portions are kept from buckling even when the optical module 14 is inserted.

Ends on the other side of the side wall 126 and the partition walls 125 and an end on the other side of the side wall 128 are connected to one another by a junction where the front EMI fingers 13 that form the peripheral edges of the module slots are provided. The return plate springs 12LF are integrally formed at portions of the junction opposite from the respective fixing portions of the guide plate 12RP. Each return plate spring 12LF has a movable piece which is elastically deformable along the X coordinate axis. The movable piece of the return plate spring 12LF is configured to bias the entire heatsink 26 toward the corresponding fixing portion of the guide plate 12RP mentioned above. Note that the configuration of the return plate springs 12LF is not limited to this example. For instance, the return plate springs 12LF may be formed separately and fixed to the junction.

An end portion of the bottom wall portion 12BP, which connects lower ends of the side wall 126 and of the partition wall 125, is in contact with a mounting surface of the printed wiring board 16. Moreover, the end portion of the bottom wall portion 12BP is in contact with one side of an annular grounding contact pad to be formed on the mounting surface of the printed wiring board 16. Thus, the receptacle cage 12 is grounded.

A plurality of press-fitting claw portions Ta are formed at predetermined intervals on the lower ends of the side wall 126, the partition walls 125, and the side wall 128, respectively. As shown in FIG. 2, the press-fitting claw portions Ta are press-fitted, respectively, into small holes formed in a surface of the printed wiring board 16 in such a way as to correspond to arrays of the press-fitting claw portions Ta. Thus, a lower end surface of the receptacle cage 12 is closely attached and fixed to the surface of the printed wiring board 16.

The receptacle connector accommodating portion, which is opened toward the surface of the printed wiring board 16, is formed by being surrounded by a receptacle connector-side closed end portion opposed to the module slot of the receptacle cage 12, and receptacle connector-side portions of the side wall 126 and the partition wall 125.

A plurality of flange portions for attaching the receptacle cage 12 onto the mounting surface of the printed wiring board 16 with screws are provided at outer peripheral portions of side surfaces and a back surface of the receptacle cage 12, respectively.

The cover 24 is integrally formed of a metal material by die-cast forming, for example, and has an outer shell portion formed by mutually joining segmented portions to be inserted into the compartments 121, 122, 123, and 124 of the receptacle cage 12, respectively. The outer shell portion comprises a pair of side walls opposed to each other, and a top board portion connecting an upper end portion of one of the side walls to an upper end portion of the other side wall. Slits where the tip end portions of the plug connectors 146 of the optical modules 14 pass through, are formed at portions of the cover 24 opposed to the respective module accommodating portions.

A groove corresponding to the partition wall 125 is formed at a boundary portion of the cover 24 between portions to be inserted into the adjacent compartments 121 and 122, respectively. Moreover, a groove corresponding to the partition wall 125 is also formed at a boundary portion of the cover 24 between portions to be inserted into the adjacent compartments 122 and 123, respectively. Furthermore, a groove corresponding to the partition wall 125 is also formed at a boundary portion of the cover 24 between portions to be inserted into the adjacent compartments 123 and 124, respectively. When the optical modules 14 are inserted into the receptacle cages 12, the side walls on the one side of the upper cases of the optical modules 14 that are adjacent to each other while interposing the corresponding partition wall 125 in between are inserted into the corresponding grooves. Thus, the optical modules 14 are accurately positioned with respect to the cover 24.

As shown in the enlarged view of FIG. 4, a plurality of claw portions 24*n* are formed at a back surface portion of the outer shell portion of the cover 24. The plurality of claw portions 24*n* are engaged with the respective openings of the above-described guide plate 12RP constituting the receptacle connector-side closed end portion.

The respective receptacle connector accommodating portions are formed inside the segmented portions to be inserted into the compartments 121, 122, 123, and 124 of the cover 24, respectively. Portions between the adjacent connector accommodating portions are partitioned by the partition walls, respectively.

The respective receptacle connectors to be provided inside the segmented portions of the cover 24 have the same structure. As shown in the enlarged view of FIG. 4, each receptacle connector 22 comprises a connector insulator provided with the slot into which the plug connector 146 of the optical module 14 is detachably inserted, and a plurality of contact terminals CT1 and CT2.

The contact terminals CT1 and CT2 are designed to electrically connect the plug connector 146 of the optical module 14, respectively, to a group of electrodes to be connected to a conductive pattern of the printed wiring board 16. A plurality of positioning pins (not shown) to be fitted into positioning holes in the printed wiring board 16 are formed at a bottom portion of the connector insulator.

In the above-described configuration, attachment operations to fix the respective heatsinks 26 from the guide plate 12RP side to the compartments of the receptacle cages 12 are operations that are similar to one another. Accordingly, an attachment operation concerning the compartment 121 will be representatively described below and explanation of the attachment operations concerning the rest of the compartments will be omitted.

First, as shown in FIG. 2, the position of the heatsink 26 is tilted with respect to the module accommodating portion such that the flexural piece 126S2 and the flexural piece 127S2 are inserted into open ends of the elongated grooves 26GA of the heatsink 26 through the opening, respectively. Next, the pressing end portion 26EF in a traveling direction of the heatsink 26 comes into contact with the movable piece of the return plate spring 12LF such that the respective pressing springs 126S1 and the respective pressing springs 127S1 are inserted into the elongated grooves 26GA of the heatsink 26, and then the heatsink 26 is further pushed in against elastic force of the movable piece of the return plate spring 12LF. At this time, a predetermined clearance is formed between the fixing portion of the guide plate 12RP and the end surface of the extension portion 26ER. In addition, when the heatsink 26 is inserted, the flexural portions having the size corresponding to the height of the grooves 26GA are first to be inserted into the grooves 26GA.

Accordingly, there is no risk of deformation of the pressing springs 126S1 and the pressing springs 127S1.

Thereafter, when the heatsink 26 is released, the groove 26EG of the extension portion 26ER is brought into the locked state with the fixing portion. Hence, the attachment of the heatsink 26 is completed.

On the other hand, to bring the heatsink 26 into an unlocked state with respect to the receptacle cage 12 and to detach the heatsink 26 from the receptacle cage 12, the heatsink 26 is first pushed in against the elastic force of the movable piece of the return plate spring 12LF, whereby the groove 26EG of the extension portion 26ER is set to the unlocked state with respect to the fixing portion. Next, after the predetermined clearance is formed between the end surface of the extension portion 26ER and the fixing portion, the end of the heatsink 26 is pulled immediately upward. Thus, the heatsink 26 is detached from the receptacle cage 12.

In addition, as shown in the enlarged view of FIG. 7A, when the optical module 14 is inserted into the compartment 121 of the receptacle cage 12 in the state where the heatsink 26 is detached from the receptacle cage 12, the tip end portion of the protection wall portion 143 of the optical module 14 comes into contact with the end portions of the guide pieces 12RT1 and 12RT2 of the guide plate 12RP even in the case where the optical module 14 is inserted with its protection wall portion 143 being lifted up. As a consequence, as shown in FIG. 7B, the tip end portion of the protection wall portion 143 is pushed down in a direction indicated with an arrow and guided to the clearance below the guide pieces 12RT1 and 12RT2, and is then pushed in along the direction indicated with the arrow against biasing force of the pair of ejection plate springs 12RPSf. Thus, the plug connector 146 of the optical module 14 is smoothly connected to the receptacle connector 22 without being damaged.

Figure 8:
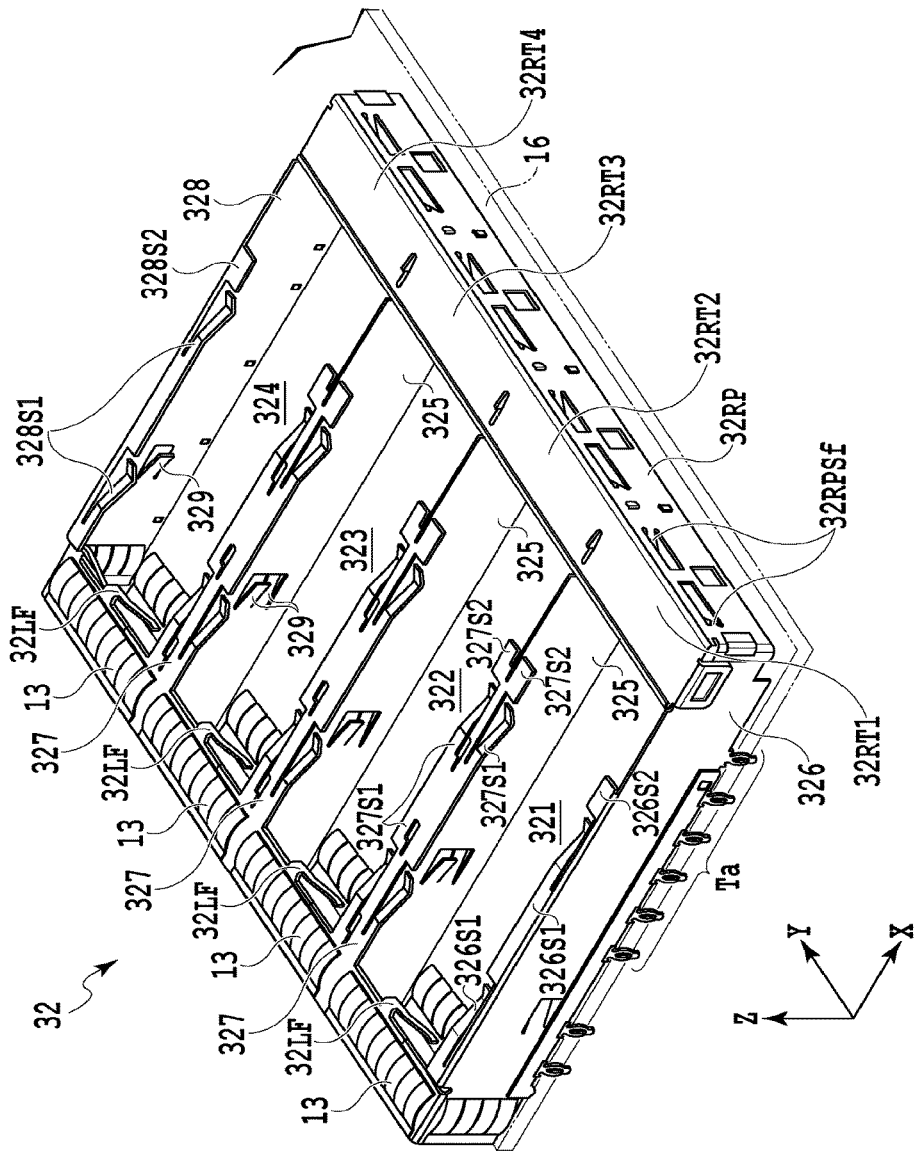
FIG. 8 is a perspective view showing a second embodiment of the receptacle assembly according to the present invention.
Figure 9:
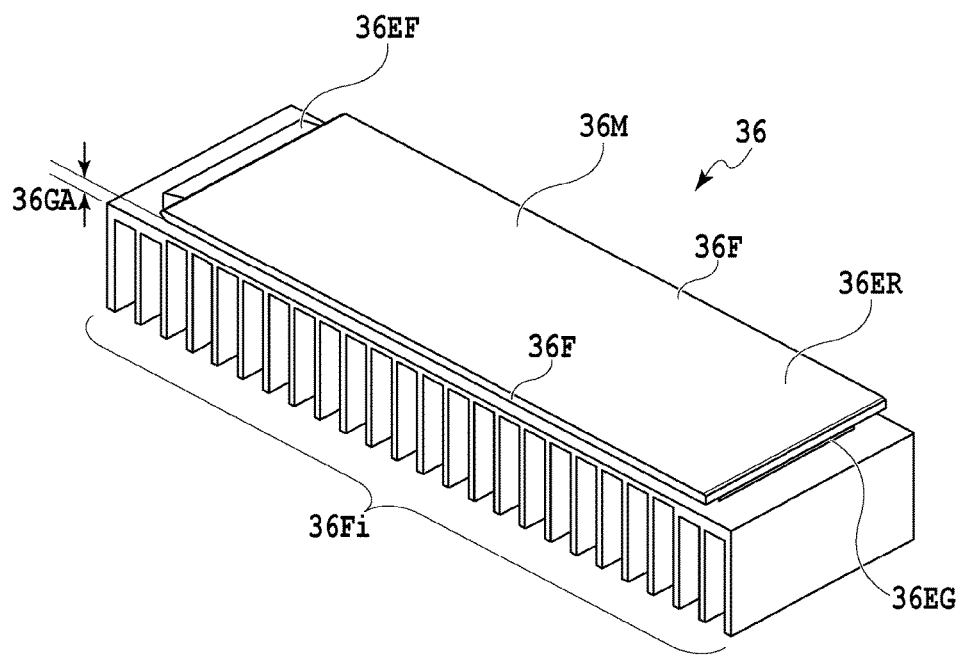
FIG. 9 is a perspective view showing a heatsink used in the example illustrated in FIG. 8.

FIG. 8 shows a second embodiment of the receptacle assembly constituting part of the transceiver module assembly according to the present invention, together with a printed wiring board disposed inside a given casing.

Note that FIG. 8 illustrates a state where a plurality of optical modules 14 and a plurality of heatsinks to be described later are detached therefrom. In addition, in FIG. 8 to FIG. 10B, the same constituents as those in the example shown in FIG. 2 will be denoted by the same reference signs and overlapping description thereof will be omitted. Although four receptacle cages are mounted on a single printed wiring board 16 in FIG. 8, the present invention is not limited to this example and five or more receptacle cages may be mounted on the single printed wiring board 16.

The transceiver module assembly comprises the above-mentioned optical modules 14 and an optical module receptacle assembly.

As shown in FIG. 8, the optical module receptacle assembly comprises, as its main constituents: receptacle cages 32 provided on the printed wiring board 16 and detachably housing the above-described optical modules 14; receptacle connectors 22 accommodated in receptacle connector accommodating portions of the receptacle cages 32; and a cover 24 including a plurality of connector accommodating portions to separately accommodate the receptacle connectors 22.

As shown in FIG. 8, each receptacle cage 32 is made of a thin plate of stainless steel or phosphor bronze, for example, and is preferably formed by press working of stainless steel or phosphor bronze having high thermal conductivity. Compartments 321, 322, 323, and 324, each of which is formed from a module accommodating portion and the receptacle connector accommodating portion, are provided inside the receptacle cages 32. The compartments 321, 322, 323, and 324 are arranged in parallel along a Y coordinate axis of the Cartesian coordinates in FIG. 8, which extends in a direction orthogonal to a direction of attachment and detachment of the optical modules 14. Since the compartments 321, 322, 323, and 324 have the same structure, the compartment 321 will be described below while omitting explanation of the rest of the compartments 322, 323, and 324.

The module accommodating portion of the compartment 321 is formed by being surrounded by a side wall 326 and a partition wall 325 opposed to each other with a predetermined interval in between, as well as a bottom wall portion 32BP of the module accommodating portion. The side wall 326 and the partition wall 325 extend in an X coordinate axis in FIG. 8, i.e., along the direction of attachment and detachment of the optical module 14. Each of the side wall 326 and the partition wall 325 is provided with a lock piece 329 located in the vicinity of a module slot to be described later. The lock pieces 329 on the side wall 326 and the partition wall 325 are opposed to each other. Each lock piece 329 is selectively engaged with a locking piece of a release plate of the optical module 14 so as to establish a locked state of the above-described optical module 14 with the module accommodating portion.

The module accommodating portion has the module slot on one end, which is opened in the direction of the X coordinate axis. Accordingly, the optical module 14 is attached and detached via the module slot. Tubular front EMI fingers 13 are provided at the entire periphery of the module slot having a substantially rectangular cross section. Moreover, additional front EMI fingers (not shown) are provided to the partition wall 325 as well. The front EMI fingers 13 and the additional front EMI fingers constitute a shield member. An inner peripheral portion of each front EMI finger 13 comes into contact with an outer peripheral portion of the inserted optical module 14. In addition, an outer peripheral portion of each front EMI finger 13 comes into contact with a peripheral edge of an opening of the casing described above, for example.

Accordingly, when the receptacle cage 32 is press-fitted into the opening of the casing, a gap between the opening of the casing and an outer peripheral portion of the receptacle cage 32 is shielded with the shield member including the front EMI fingers 13 made of a metal. Thus, noise is confined in the above-described casing, and there is no risk of leakage of the noise to the outside through a gap between the outer peripheral portion of the optical module 14 and an inner peripheral portion of the module accommodating portion.

In the meantime, the other end of the module accommodating portion opposite from the module slot communicates with the inside of the receptacle connector accommodating portion. An opening opened along a Z coordinate axis in FIG. 8 is formed at a portion of the receptacle cage 32 opposite from the bottom wall portion 32BP. A heatsink support mechanism which detachably supports a heatsink 36 to be described later is provided on a peripheral edge of the opening. Here, the heatsink support mechanism which detachably supports the heatsink 36 is also provided to each of the compartments 322, 323, and 324. Accordingly, the respective heatsinks 36 are selectively disposed on the receptacle cages 32 via the heatsink support mechanisms in such a way as to block the above-mentioned openings of the compartments 321, 322, 323, and 324.

Each heatsink 36 is made of a metal having high thermal conductivity such as aluminum. As shown in the enlarged view of FIG. 9, the heatsink 36 has a plurality of fins 36Fi (i=1 to n, n is a positive integer) which are arranged in parallel with one another and at predetermined intervals along the X coordinate axis. The plurality of fins 36Fi are formed substantially perpendicular to a flat surface of a base portion 36M to be supported by the heatsink support mechanism. A pair of flange portions 36F are formed opposite to each other at a predetermined length on two side portions of the base portion 36M, respectively. An elongated groove 36GA is formed between each flange portion 36F and a junction where lower end portions of the plurality of fins 36Fi are joined together. The elongated groove 36GA is slidably engaged with: a flexural piece 326S2 and two pressing springs 326S1 which are formed at an upper end portion of the side wall 326; and a flexural piece 327S2 and two pressing springs 327S1 of a top plate 327 provided at an upper end of the partition wall 325. A pressing end portion 36EF is formed at one end in a longitudinal direction of the base portion 36M. The pressing end portion 36EF has a smaller width than a width of a central part of the base portion 36M and comes into contact with a return plate spring 32LF to be described later. In addition, a groove 36EG which is locked with a fixing portion of a guide plate 32RP to be described later at the time of attachment of the heatsink 36 is formed on a locking end 36ER in the longitudinal direction of the base portion 36M. When the optical module 14 is attached to the inside of the receptacle cage 32, a heat transfer surface of the base portion 36M comes into contact with an upper plate of the optical module 14 and a surface of a protection wall portion 143. As a consequence, heat from the optical module 14 is dissipated via the heatsink 36. In this case, a heat transfer area is expanded more by bringing the heat transfer surface of the base portion 36M into contact with the entire surface of the upper plate of the inserted optical module 14. Thus, the optical module 14 can be cooled more efficiently.

As shown in FIG. 8, the above-mentioned heatsink support mechanism comprises: the flexural piece 326S2 and the two pressing springs 326S1 formed at a flexural portion provided at an uppermost end of the side wall 326 constituting the receptacle cage 32; the flexural piece 327S2 and the two pressing springs 327S1 formed at the top plate 327 provided at the upper end of each of the partition walls 325; and a flexural piece 328S2 and two pressing springs 128S1 formed at a flexural portion provided at an uppermost end of a side wall 328.

As heatsink fixing means, the guide plate 32RP provided at a back surface portion of the receptacle cage 32, and plate springs 32LF each of which biases the groove 36EG of the corresponding heatsink 36 toward the corresponding fixing portion of the guide plate 32RP are provided in the receptacle cage 32.

The pressing springs 326S1 as well as the flexural piece 326S2 of the side wall 326 and the top plate 327 provided at the upper end of the partition wall 325 are formed on a common plane in such a way as to face one another with a predetermined interval in between. Ends on one side of the side walls 326 and 328 and ends on one side of the respective partition walls 325 are connected to one another by the guide plate 32RP which extends along the Y coordinate axis in FIG. 8.

The guide plate 32RP comprises: a cover fixation unit coming into contact with the ends on the one side of the side walls 326 and 328 as well as the ends on the one side of the respective partition walls 325 and constituting the back surface portion of the receptacle cage 32; and guide pieces 32RT1, 32RT2, 32RT3, and 32RT4 formed continuously with an upper end portion of the cover fixation unit.

Two ends in a longitudinal direction of the cover fixation unit are locked with outer peripheral portions of the side walls 326 and 328, respectively. Pairs of ejection plate springs 32RPSf are formed on a common straight line at the cover fixation unit. The pairs of the ejection plate springs 32RPSf are formed corresponding to the compartments 321, 322, 323, and 324, respectively. A rectangular opening, into which a claw portion 24n of the cover 24 is inserted, is formed at a position below each pair of the ejection plate springs 32RPSf. In this way, the cover 24 is fixed to the guide plate 32RP. Each pair of ejection plate springs 32RPSf are configured to bias the protection wall portion 143 of each attached optical module 14 in such a way as to push outward just in a predetermined amount from the receptacle cage 32 through the module slot.

The guide pieces 32RT1, 32RT2, 32RT3, and 32RT4 are placed on and locked with upper parts of the ends on the one side of the side walls 326 and 328 and upper parts of the ends on the one side of the respective partition walls 325. The guide pieces 32RT1, 32RT2, 32RT3, and 32RT4 are formed in parallel with one another, and extend at a predetermined distance toward the flexural pieces 326S2, 327S2, and 328S2, respectively. Tip end portions of the guide pieces 32RT1, 32RT2, 32RT3, and 32RT4 are formed at such positions away from end portions of the flexural piece 326S2, the flexural pieces 327S2, and the flexural piece 328S2 by a predetermined distance, respectively. Thus, the flexural piece 326S2, the flexural pieces 327S2, and the flexural piece 328S2 can easily be inserted into the elongated grooves 36GA of the heatsinks 36, respectively, in the state where the pressing end portions 36EF are tilted obliquely downward to the left toward the inside of the module accommodating portions.

Ends of the guide piece 32RT1 and the guide piece 32RT2, and ends of the guide piece 32RT3 and the guide piece 32RT4 are formed as the fixing portions, with which the grooves 36EG of the heatsinks 36 described above are locked, respectively.

A flexural portion 32RS formed integrally with the guide piece 32RT1, and a flexural portion (not shown) formed integrally with the guide piece 32RT4 are locked with the outer peripheral portions of the side walls 326 and 328, respectively.

Figure 10A:
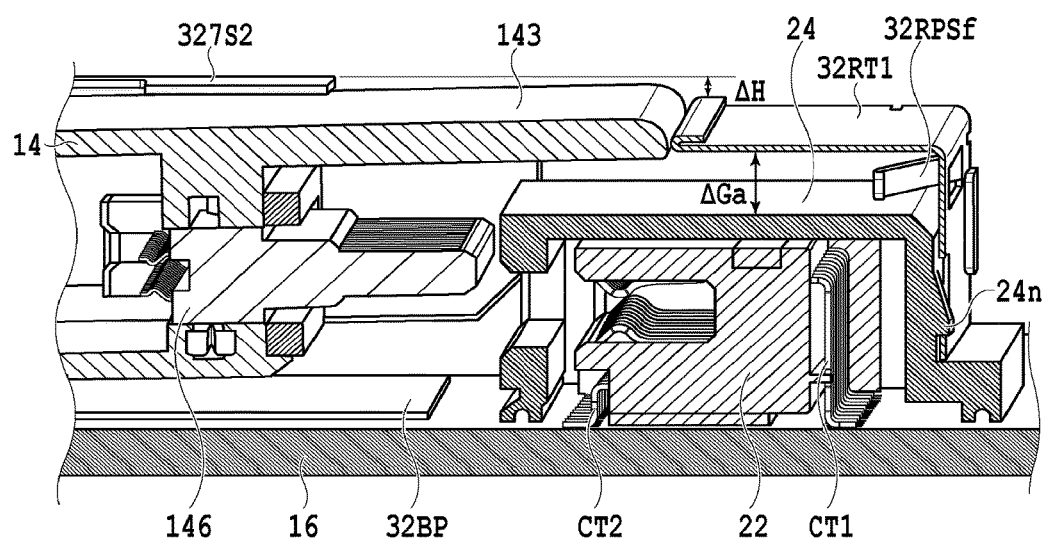
FIG. 10A is a partial cross-sectional view made available for the explanation of the operation in the example illustrated in FIG. 8.
Figure 10B:
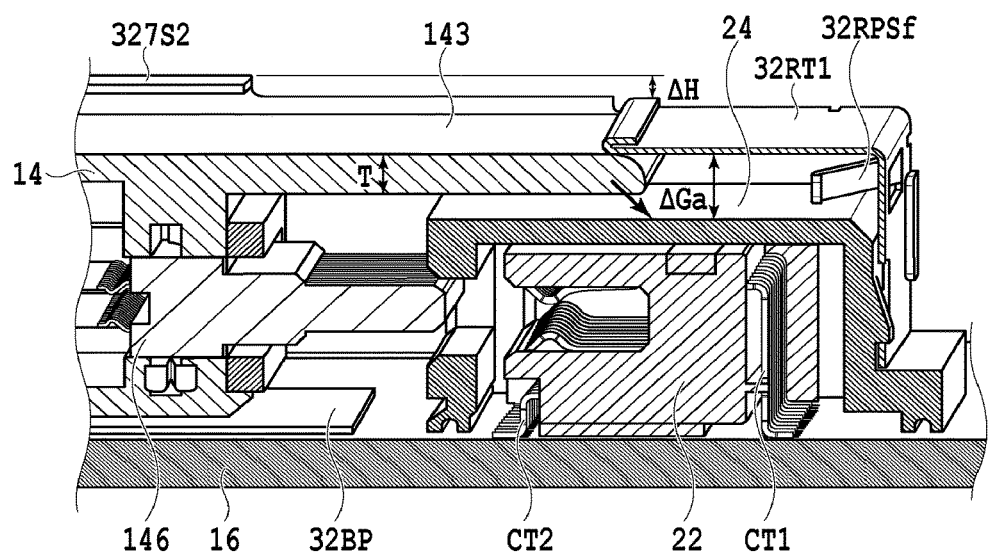
FIG. 10B is a partial cross-sectional view made available for the explanation of the operation in the example illustrated in FIG. 8.

As shown in FIG. 10A and FIG. 10B, a position of each of the guide pieces 32RT1, 32RT2, 32RT3, and 32RT4 is set to such a position lower by a predetermined dimension ΔH than a position of the corresponding top plate 327. In addition, a distance ΔGa between an inner peripheral portion of each of the guide pieces 32RT1, 32RT2, 32RT3, and 32RT4 and an upper surface of an outer peripheral portion of the cover 24 is set larger than a thickness T of the protection wall portion 143 of the optical module 14. In addition, the distance ΔGa is set such that a clearance between an upper surface of the protection wall 143 and an inner peripheral surface of the guide piece 32RT1 becomes larger than a clearance between a slit of the cover 24 and the plug connector 146 when the protection wall 143 is inserted between the guide piece 32RT1 and the upper surface of the outer peripheral portion of the cover 24.

The pressing springs 326S1 to bias one of the flange portions 36F of the heatsink 36 downward are formed at two positions at a predetermined interval on a common straight line at the flexural portion of the side wall 326. A base end of each pressing spring 326S1 is formed integrally with the flexural portion of the side wall 326. A tail end of each pressing spring 326S1 extends toward the flexural piece 326S2 and has a folded portion which is elastically deformable along the Z coordinate axis. The folded portion has a curvature corresponding to a height of each elongated groove 36GA of the heatsink 36.

The pressing springs 327S1 to bias the other flange portion 36F of the heatsink 36 are formed at two positions at a predetermined interval on a common straight line at each top plate 327 as well. A base end of each pressing spring 327S1 is formed integrally with the top plate 327. A tail end of each pressing spring 327S1 extends toward the flexural piece 327S2 and has a folded portion which is elastically deformable along the Z coordinate axis. The folded portion has the curvature corresponding to the height of each elongated groove 36GA of the heatsink 36. Thus, if the heatsink 36 is not attached, the optical module 14 does not interfere with the pressing springs 326S1 or the pressing springs 327S1 and the folded portions are kept from buckling even when the optical module 14 is inserted.

Ends on the other side of the side wall 326 and the partition walls 325 and an end on the other side of the side wall 328 are connected to one another by a junction where the front EMI fingers 13 that form the peripheral edges of the module slots are provided. The return plate springs 32LF are integrally formed at portions of the junction opposite from the respective fixing portions of the guide plate 32RP. Each return plate spring 32LF has a movable piece which is elastically deformable along the X coordinate axis. The movable piece of the return plate spring 32LF is configured to bias the entire heatsink 36 toward the corresponding fixing portion of the guide plate 32RP mentioned above. Note that the configuration of the return plate springs 32LF is not limited to this example. For instance, the return plate springs 32LF may be formed separately and fixed to the junction.

An end portion of a bottom wall portion 32BP, which connects lower ends of the side wall 326 and of the partition wall 325, is in contact with a mounting surface of the printed wiring board 16. Moreover, the end portion of the bottom wall portion 32BP is in contact with one side of an annular grounding contact pad to be formed on the mounting surface of the printed wiring board 16. Thus, the receptacle cage 32 is grounded.

A plurality of press-fitting claw portions Ta are formed at predetermined intervals on the lower ends of the side wall 326, the partition walls 325, and the side wall 328, respectively. As shown in FIG. 8, the press-fitting claw portions Ta are press-fitted, respectively, into small holes formed in a surface of the printed wiring board 16 in such a way as to correspond to arrays of the press-fitting claw portions Ta. Thus, a lower end surface of the receptacle cage 32 is closely attached and fixed to the surface of the printed wiring board 16.

The receptacle connector accommodating portion, which is opened toward the surface of the printed wiring board 16, is formed by being surrounded by a receptacle connector-side closed end portion opposed to the module slot of the receptacle cage 32, and receptacle connector-side portions of the side wall 326 and the partition wall 325.

A plurality of flange portions for attaching the receptacle cage 32 onto the mounting surface of the printed wiring board 16 with screws are provided at outer peripheral portions of side surfaces and a back surface of the receptacle cage 32, respectively.

In the above-described configuration, attachment operations to fix the respective heatsinks 36 from the guide plate 32RP side to the compartments of the receptacle cages 32 are operations that are similar to one another. Accordingly, an attachment operation concerning the compartment 121 will be representatively described below and explanation of the attachment operations concerning the rest of the compartments will be omitted.

First, the position of the heatsink 36 is tilted with respect to the module accommodating portion such that the flexural piece 326S2 and the flexural piece 327S2 are inserted into open ends of the elongated grooves 36GA of the heatsink 36 through the opening, respectively. Next, the pressing end portion 36EF in a traveling direction of the heatsink 36 comes into contact with the movable piece of the return plate spring 32LF such that the respective pressing springs 326S1 and the respective pressing springs 327S1 are inserted into the elongated grooves 36GA of the heatsink 36, and then the heatsink 36 is further pushed in against elastic force of the movable piece of the return plate spring 32LF. At this time, a predetermined clearance is formed between the fixing portion of the guide plate 32RP and an end surface of the locking end 36ER. In addition, when the heatsink 36 is inserted, the flexural portions having the size corresponding to the height of the grooves 36GA are first to be inserted into the grooves 36GA. Accordingly, there is no risk of deformation of the pressing springs 326S1 and the pressing springs 327S1.

Thereafter, when the heatsink 36 is released, the groove 36EG of the locking end 36ER is brought into the locked state with the fixing portion. Hence, the attachment of the heatsink 36 is completed.

On the other hand, to bring the heatsink 36 into an unlocked state with respect to the receptacle cage 32 and to detach the heatsink 36 from the receptacle cage 32, the heatsink 36 is first pushed in against the elastic force of the movable piece of the return plate spring 32LF, whereby the groove 36EG of the locking end 36ER is set to the unlocked state with respect to the fixing portion. Next, after the predetermined clearance is formed between the end surface of the locking end 36ER and the fixing portion, the end of the heatsink 36 is pulled immediately upward. Thus, the heatsink 36 is detached from the receptacle cage 32.

In addition, as shown in the enlarged view of FIG. 10A, when the optical module 14 is inserted into the compartment 321 of the receptacle cage 32 in the state where the heatsink 36 is detached from the receptacle cage 32, the tip end portion of the protection wall portion 143 of the optical module 14 comes into contact with the end portion of the guide piece 32RT1 of the guide plate 32RP even in the case where the optical module 14 is inserted with its protection wall portion 143 being lifted up. As a consequence, as shown in FIG. 10B, the tip end portion of the protection wall portion 143 is pushed down in a direction indicated with an arrow and guided to the clearance below the guide piece 32RT1, and is then pushed in along the direction indicated with the arrow against biasing force of the pair of ejection plate springs 32RPSf. Thus, the plug connector 146 of the optical module 14 is smoothly connected to the receptacle connector 22 without being damaged.

In the above-described examples of the receptacle assembly according to the present invention, the receptacle cages 12 and 32 are provided with the four compartments. However, the present invention is not limited to these examples. For instance, one to three compartments or five or more compartments may be provided.

Moreover, in the above-described examples, each optical module 14 is configured to accommodate the single module board while each receptacle connector 22 is provided with one slot to which the connection end portion of the single module board is inserted. However, the present invention is not limited to these examples. For instance, an optical module may be configured to accommodate two module boards that are layered while providing a predetermined interval in between, and a receptacle connector may be provided with two slots to which connection end portions of the module boards are respectively inserted. In this case, a cover is provided with two slits, for example, to which the connection end portions of the two module boards are respectively inserted.

Figure 11:
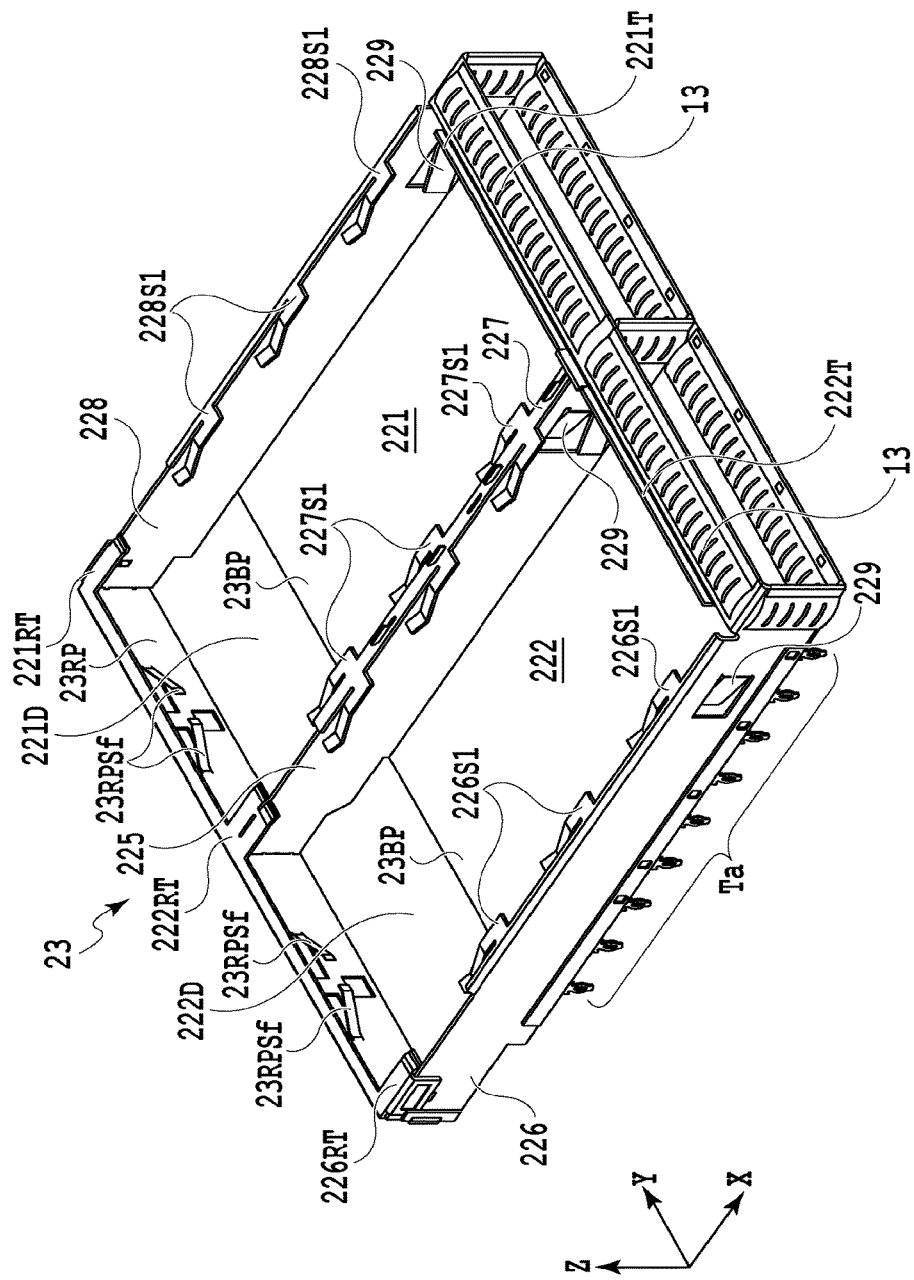
FIG. 11 is a perspective view showing a receptacle cage used in a third embodiment of the receptacle assembly according to the present invention.

FIG. 11 shows a receptacle cage used in a third embodiment of the receptacle assembly constituting part of the transceiver module assembly according to the present invention. FIG. 11 illustrates a state where a plurality of optical modules 14 and a plurality of heatsinks to be described later are detached therefrom.

The transceiver module assembly comprises the above-mentioned optical modules 14 and an optical module receptacle assembly.

The optical module receptacle assembly comprises, as its main constituents: receptacle cages 23 provided on the above-described printed wiring board 16 and detachably housing the above-described optical modules 14; receptacle connectors (not shown) accommodated in receptacle connector accommodating portions of the receptacle cages 23; and a cover (not shown) including a plurality of connector accommodating portions to separately accommodate the receptacle connectors.

As shown in FIG. 11, each receptacle cage 23 is made of a thin plate of stainless steel or phosphor bronze, for example, and is preferably formed by press working of stainless steel or phosphor bronze having high thermal conductivity. Compartments 221 and 222, each of which is formed from a module accommodating portion and the receptacle connector accommodating portion, are provided inside the receptacle cages 23. The compartments 221 and 222 are arranged in parallel along a Y coordinate axis of the Cartesian coordinates in FIG. 11, which extends in a direction orthogonal to a direction of attachment and detachment of the optical modules 14. Since the compartments 221 and 222 have the same structure, the compartment 221 will be described below while omitting explanation of the other compartment 222.

The module accommodating portion of the compartment 221 is formed by being surrounded by a side wall 238 and a partition wall 235 opposed to each other with a predetermined interval in between, as well as a bottom wall portion 23BP of the module accommodating portion. The side wall 228 and the partition wall 225 extend in an X coordinate axis in FIG. 11, i.e., along the direction of attachment and detachment of the optical module 14. Each of the side wall 228 and the partition wall 225 is provided with a lock piece 229 located in the vicinity of a module slot to be described later. The lock pieces 229 on the side wall 228 and the partition wall 225 are opposed to each other. Each lock piece 229 is selectively engaged with a locking piece of a release plate of the optical module 14 so as to establish a locked state of the above-described optical module 14 with the module accommodating portion.

The module accommodating portion has the module slot on one end, which is opened in the direction of the X coordinate axis. Accordingly, the optical module 14 is attached and detached via the module slot. Tubular front EMI fingers 13 are provided at the entire periphery of the module slot having a substantially rectangular cross section. The front EMI fingers 13 and other front EMI fingers constitute a shield member. An inner peripheral portion of each front EMI finger 13 comes into contact with an outer peripheral portion of the inserted optical module 14. In addition, an outer peripheral portion of each front EMI finger 13 comes into contact with a peripheral edge of an opening of the casing described above, for example.

Accordingly, when the receptacle cage 23 is press-fitted into the opening of the casing, a gap between the opening of the casing and an outer peripheral portion of the receptacle cage 23 is shielded with the shield member including the front EMI fingers 13 made of a metal. Thus, noise is confined in the above-described casing, and there is no risk of leakage of the noise to the outside through a gap between the outer peripheral portion of the optical module 14 and an inner peripheral portion of the module accommodating portion.

Figure 12A:
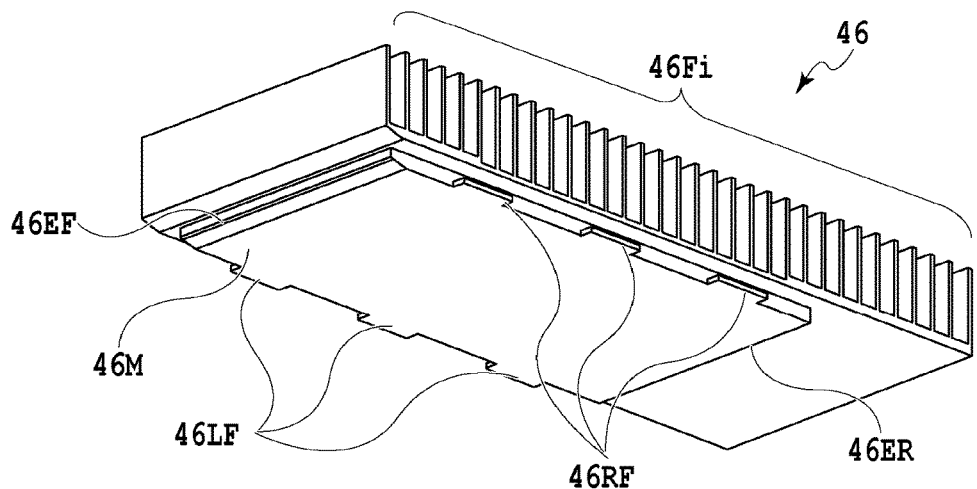
FIG. 12A is a perspective view showing an example of a heatsink used in the example illustrated in FIG. 11.
Figure 12B:
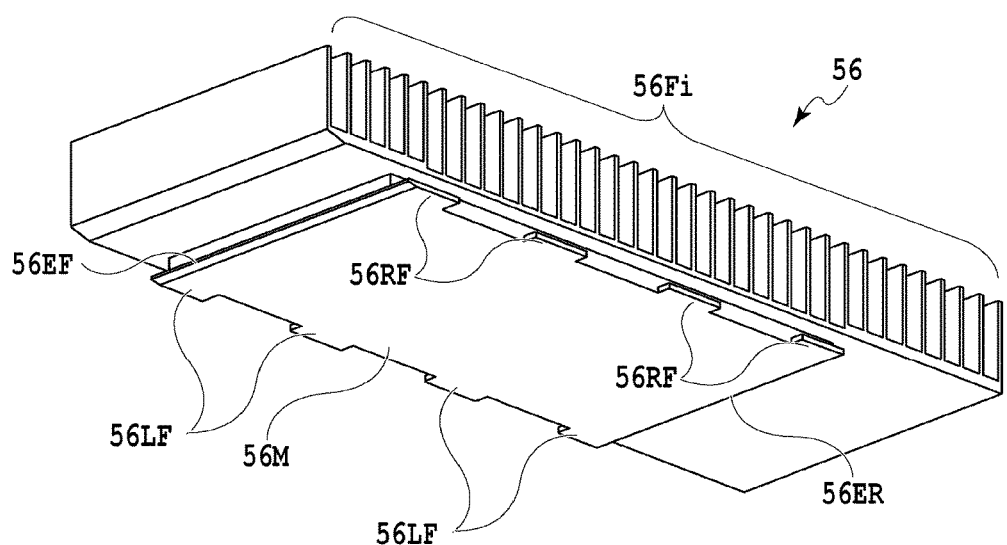
FIG. 12B is a perspective view showing another example of the heatsink used in the example illustrated in FIG. 11.

In the meantime, the other end of the module accommodating portion opposite from the module slot communicates with the inside of the receptacle connector accommodating portion. An opening opened along a Z coordinate axis in FIG. 11 is formed at a portion of the receptacle cage 23 opposite from the bottom wall portion 23BP. A heatsink support mechanism which detachably supports a heatsink 46 (see FIG. 12A) or a heatsink 56 (see FIG. 12B) to be described later is provided on a peripheral edge of the opening. Here, the heatsink support mechanism which detachably supports any of the heatsinks 46 and 56 is also provided on a peripheral edge of the compartment 222. Accordingly, each heatsink 46 or 56 is selectively disposed on the receptacle cage 23 via the heatsink support mechanism in such a way as to block the above-mentioned opening of the compartment 221 or 222.

The heatsink 46 is made of a metal having high thermal conductivity such as aluminum. As shown in the enlarged view of FIG. 12A, the heatsink 46 has a plurality of fins 46Fi (i=1 to n, n is a positive integer) which are arranged in parallel with one another and at predetermined intervals along the X coordinate axis. The plurality of fins 46Fi are formed substantially perpendicular to a flat surface of a base portion 46M to be supported by the heatsink support mechanism. A plurality of, such as three lock pieces 46RF and three lock pieces 46LF each having a predetermined length are formed, respectively, on two side portions of the base portion 46M in such a way as to be opposed to one another. The three lock pieces 46RF and the three lock pieces 46LF are formed at predetermined regular intervals along the X coordinate axis.

A clearance is formed between each lock piece 46RF or 46LF and a junction where lower end portions of the plurality of fins 46Fi are joined together. Three pressing springs 326S1 to be formed at an upper end portion of the side wall 228 to be described later, and three pressing springs 227S1 of a top plate 227 provided at an upper end of the partition wall 225 are inserted through the clearances and are slidably engaged with the lock pieces 46RF and 46LF.

A contacting end portion 46EF is formed at one end in a longitudinal direction of the base portion 46M. The contacting end portion 46EF comes into contact with a locking piece 221T, which is formed adjacent to the front EMI fingers 13, when the heatsink 46 is disposed on the receptacle cage 23.

In addition, a rear end 46ER is formed at the other end of the base portion 46M.

When the optical module 14 is attached to the inside of the receptacle cage 23, a heat transfer surface of the base portion 46M comes into contact with an upper plate of the optical module 14 and a surface of a protection wall portion 143. As a consequence, heat from the optical module 14 is dissipated via the heatsink 46. In this case, a heat transfer area is expanded more by bringing the heat transfer surface of the base portion 46M into contact with the entire surface of the upper plate of the inserted optical module 14. Thus, the optical module 14 can be cooled more efficiently.

The heatsink 56 is made of a metal having high thermal conductivity such as aluminum. As shown in the enlarged view of FIG. 12B, the heatsink 56 has a plurality of fins 56Fi (i=1 to n, n is a positive integer) which are arranged in parallel with one another and at predetermined intervals along the X coordinate axis. The plurality of fins 56Fi are formed substantially perpendicular to a flat surface of a base portion 46M to be supported by the heatsink support mechanism. A plurality of, such as four lock pieces 56RF and four lock pieces 56LF each having a predetermined length are formed, respectively, on two side portions of the base portion 56M in such a way as to be opposed to one another. The four lock pieces 56RF and the four lock pieces 56LF are formed at predetermined regular intervals along the X coordinate axis.

A clearance is formed between each lock piece 56RF or 56LF and a junction where lower end portions of the plurality of fins 56Fi are joined together. The three pressing springs 326S1 to be formed at the upper end portion of the side wall 228 to be described later, and the three pressing springs 227S1 of the top plate 227 provided at the upper end of the partition wall 225 are inserted through the clearances and are slidably engaged with the lock pieces 56RF and 56LF.

A contacting end portion 56EF is formed at one end in a longitudinal direction of the base portion 56M. The contacting end portion 56EF comes into contact with the locking piece 221T, which is formed adjacent to the front EMI fingers 13, when the heatsink 56 is disposed on the receptacle cage 23.

In addition, a rear end 56ER is formed at the other end of the base portion 56M.

When the optical module 14 is attached to the inside of the receptacle cage 23, a heat transfer surface of the base portion 56M comes into contact with the upper plate of the optical module 14 and the surface of the protection wall portion 143. As a consequence, heat from the optical module 14 is dissipated via the heatsink 46. In this case, a heat transfer area is expanded more by bringing the heat transfer surface of the base portion 56M into contact with the entire surface of the upper plate of the inserted optical module 14. Thus, the optical module 14 can be cooled more efficiently.

As shown in FIG. 11, the above-mentioned heatsink support mechanism comprises: the three pressing springs 228S1 formed at a flexural portion provided at an uppermost end of the side wall 228 constituting the receptacle cage 23; the three pressing springs 227S1 formed at the top plate 227 provided at the upper end of each partition wall 325; and three pressing springs 226S1 formed at a flexural portion provided at an uppermost end of the side wall 226.

The pressing springs 228S1 of the side wall 228 and the top plate 227 provided at the upper end of the partition wall 225 are formed on a common plane in such a way as to face one another with a predetermined interval in between. Ends on one side of the side walls 226 and 228 and an end on one side of the partition wall 225 are connected to one another by a guide plate 23RP which extends along the Y coordinate axis in FIG. 11.

The guide plate 23RP comprises: a cover fixation unit coming into contact with the ends on the one side of the side walls 226 and 228 as well as the end on the one side of the partition wall 225 and constituting a back surface portion of the receptacle cage 23; and guide pieces 221RT, 222RT, and 226RT formed continuously with an upper end portion of the cover fixation unit.

Two ends in a longitudinal direction of the cover fixation unit are locked with outer peripheral portions of the side walls 226 and 228, respectively. Pairs of ejection plate springs 23RPSf are formed on a common straight line at the cover fixation unit. The pairs of the ejection plate springs 23RPSf are formed corresponding to the compartments 221 and 222, respectively. A rectangular opening, into which a claw portion 24n of a cover 24 is inserted, is formed at a position below each pair of the ejection plate springs 23RPSf. In this way, the cover 24 is fixed to the guide plate 23RP. Each pair of ejection plate springs 23RPSf are configured to bias the protection wall portion 143 of each attached optical module 14 in such a way as to push outward just in a predetermined amount from the receptacle cage 23 through the module slot.

Figure 13A:
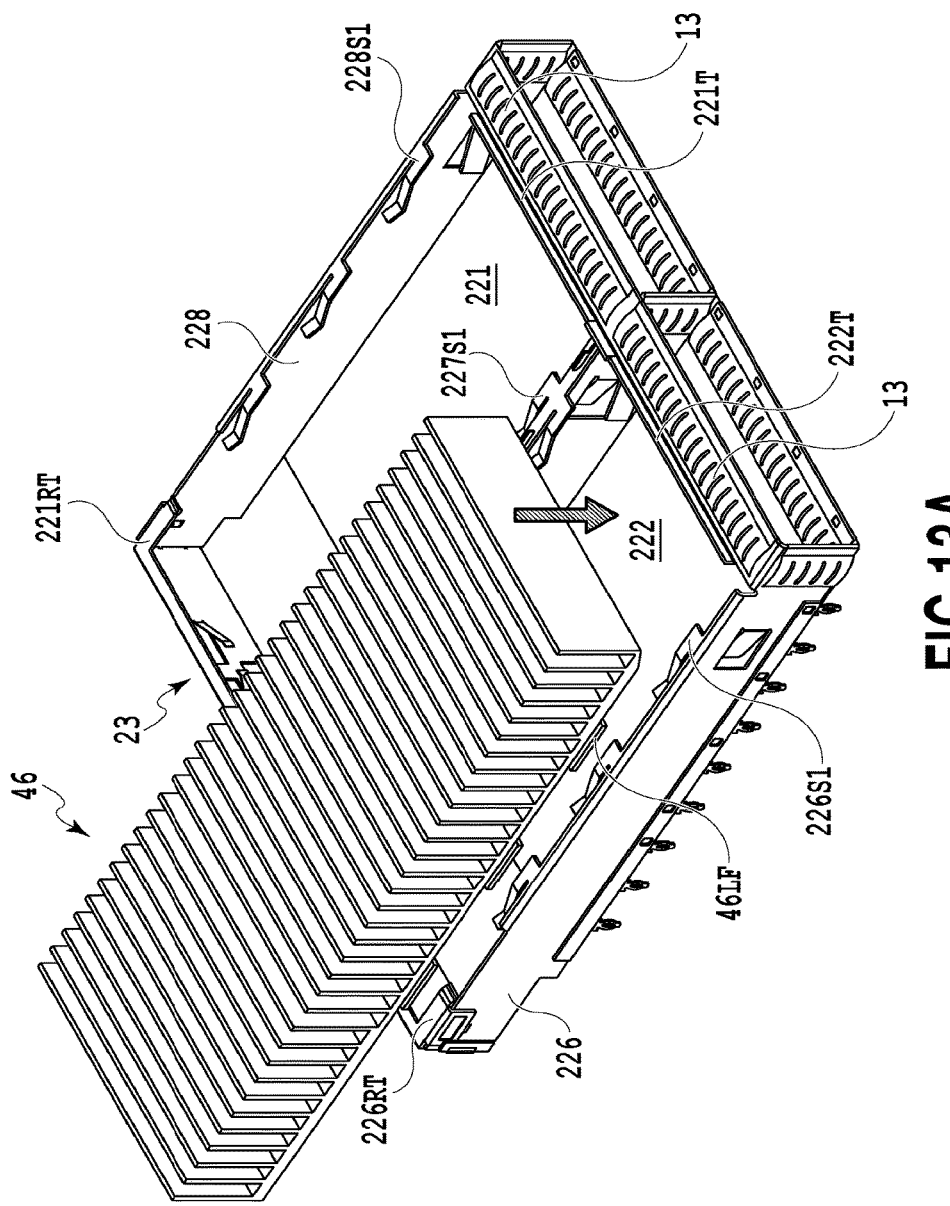
FIG. 13A is a perspective view made available for explanation of an operation to attach the example of the heatsink in the example illustrated in FIG. 11.

The guide pieces 221RT, 222RT, and 226RT are placed on and locked with upper parts of the ends on the one side of the side walls 228 and 226 and an upper part of the end on the one side of the partition wall 225. The guide pieces 221RT, 222RT, and 226RT are formed in parallel with one another, and extend at a predetermined distance toward the pressing springs 228S1, 227S1, and 226S1, respectively. Tip end portions of the guide pieces 221RT, 222RT, and 226RT are formed at such positions away from end portions of the pressing springs 228S1, 227S1, and 226S1 by a predetermined distance, respectively. In addition, among the pressing springs 228S1, 227S1, and 226S1, the end portions of the pressing springs on the same row are located away from one another by a predetermined distance. The predetermined distance is set slightly larger than the length along the X coordinate axis of each of the above-described locking pieces 46RF and 46LF of the heatsink 46, for example. Thus, each of the locking pieces 46RF and 46LF of the heatsink is easily inserted between the corresponding pressing springs 228S1, 227S1, and 226S1 on the same row as shown in FIG. 13A.

As with the example shown in FIG. 7B, a position along the Z coordinate axis of each of the guide pieces 221RT, 222RT, and 226RT3 is set to such a position lower by a predetermined dimension than a position of the top plate 227. In addition, a distance between an inner peripheral portion of each of the guide pieces 221RT, 222RT, and 226RT3 and an upper surface of an outer peripheral portion of the cover 24 is set larger than a thickness of the protection wall portion 143 of the optical module 14. In addition, the distance is set such that a clearance between an upper surface of the protection wall 143 and an inner peripheral surface of the guide piece 221RT becomes larger than a clearance between a slit of the cover 24 and the plug connector 146 when the protection wall 143 is inserted between the guide piece 221RT and the upper surface of the outer peripheral portion of the cover 24.

The pressing springs 228S1 to bias the locking pieces 46RF on one side of the heatsink 46 are formed at three positions at predetermined intervals on a common straight line at the side wall 228. A tail end of each pressing spring 228S1 extends toward the guide piece 221RT and has a folded portion which is elastically deformable along the Z coordinate axis.

The pressing springs 227S1 to bias the locking pieces 46LF on the other side of the heatsink 46 are formed at three positions at predetermined intervals on a common straight line at the top plate 227 as well. A base end of each pressing spring 327S1 is formed integrally with the top plate 227. A tail end of each pressing spring 227S1 extends toward the guide piece 222RT and has a folded portion which is elastically deformable along the Z coordinate axis. Thus, if the heatsink 46 is not attached, the optical module 14 does not interfere with the pressing springs 228S1 or the pressing springs 227S1 and the folded portions are kept from buckling even when the optical module 14 is inserted.

Ends on the other side of the side wall 228 and the partition wall 225 and an end on the other side of the side wall 226 are connected to one another by a junction where the front EMI fingers 13 that form the peripheral edges of the module slots are provided.

An end portion of a bottom wall portion 23BP, which connects lower ends of the side wall 228 and of the partition wall 225, is in contact with a mounting surface of the printed wiring board 16. Moreover, the end portion of the bottom wall portion 23BP is in contact with one side of an annular grounding contact pad to be formed on the mounting surface of the printed wiring board 16. Thus, the receptacle cage 23 is grounded.

A plurality of press-fitting claw portions Ta are formed at predetermined intervals on the lower ends of the side wall 226, the partition wall 225, and the side wall 228, respectively. The press-fitting claw portions Ta are press-fitted, respectively, into small holes formed in a surface of the printed wiring board 16 in such a way as to correspond to arrays of the press-fitting claw portions Ta. Thus, a lower end surface of the receptacle cage 23 is closely attached and fixed to the surface of the printed wiring board 16.

The receptacle connector accommodating portion, which has an opening 221D opened toward the surface of the printed wiring board 16, is formed by being surrounded by a receptacle connector-side closed end portion opposed to the module slot of the receptacle cage 23, and receptacle connector-side portions of the side wall 228 and the partition wall 225.

A plurality of flange portions (not shown) for attaching the receptacle cage 23 onto the mounting surface of the printed wiring board 16 with screws are provided at outer peripheral portions of side surfaces and a back surface of the receptacle cage 23, respectively.

Figure 13B:
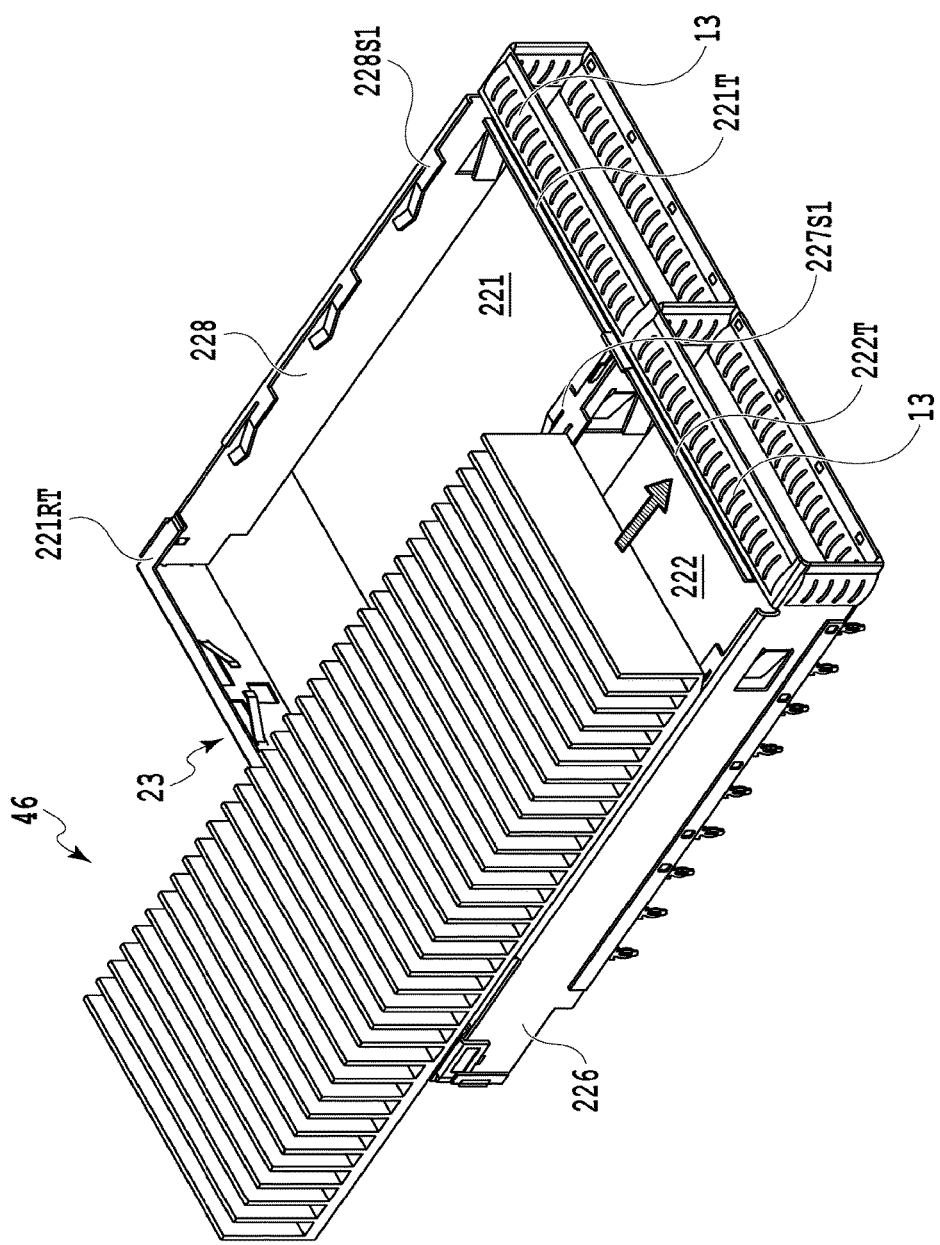
FIG. 13B is a perspective view made available for explanation of an operation to attach the example of the heatsink in the example illustrated in FIG. 11.
Figure 13C:
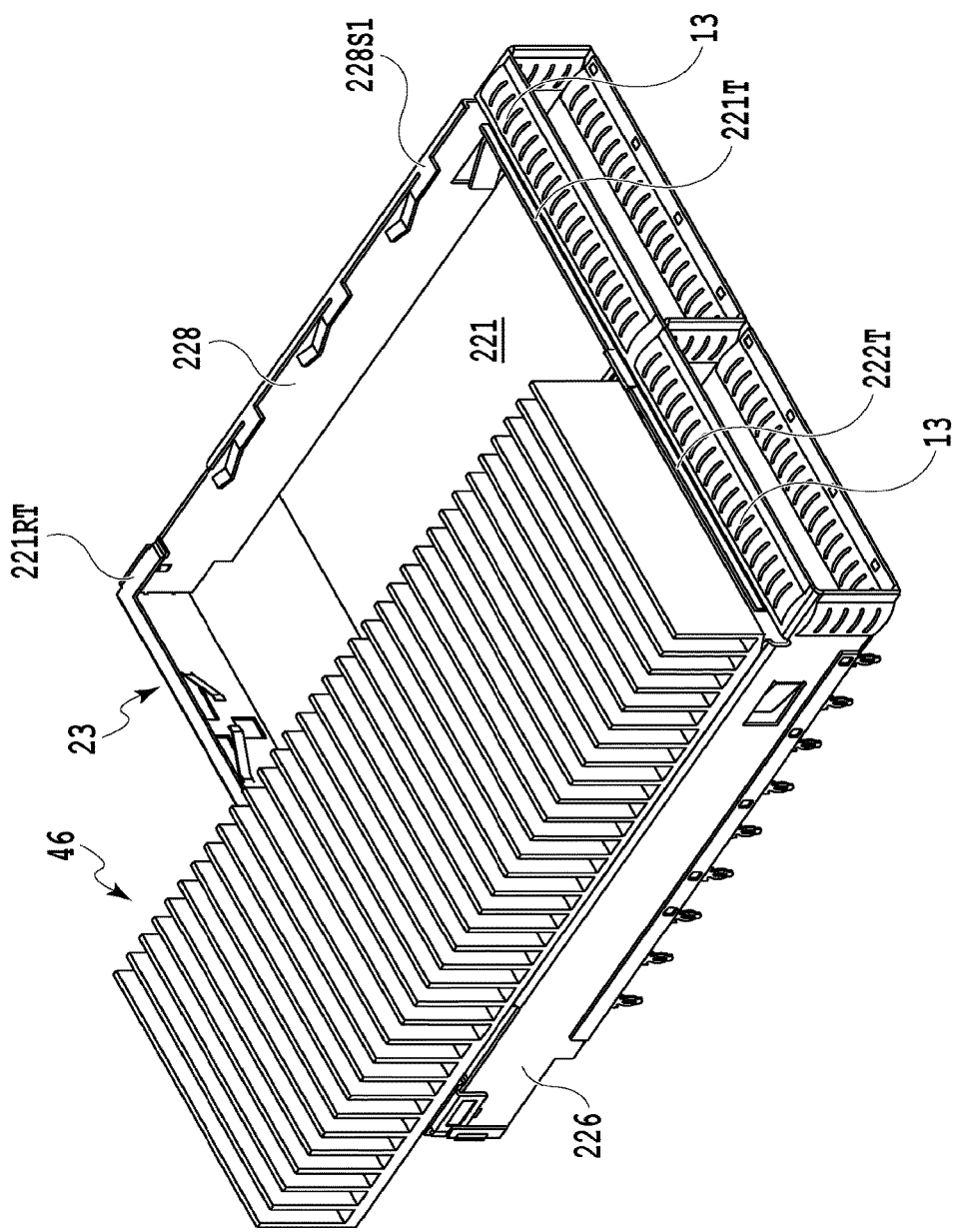
FIG. 13C is a perspective view made available for explanation of an operation to attach the example of the heatsink in the example illustrated in FIG. 11.

In the above-described configuration, attachment operations to fix the respective heatsinks 46 from positions immediately above to the compartments of the receptacle cage 23 as shown in FIG. 13A to FIG. 13C are operations that are similar to one another. Accordingly, an attachment operation concerning the compartment 222 will be representatively described below and explanation of the attachment operation concerning the other compartment will be omitted.

First, the locking pieces 46RF and 46LF of the heatsink 46 are located above the compartment 222 of the receptacle cage 23 in such a way as to be opposed to spaces between the pressing springs 226S1 on the same row and spaces between the pressing springs 227S1 on the same row, respectively. Next, the base portion 46M of the heatsink 46 is inserted into the compartment 222 through the opening of the compartment 222 of the receptacle cage 23, and the heatsink 46 is placed on the upper end of the side wall 226 and on the top plate 127 as shown in FIG. 13B. Subsequently, the entire heatsink 46 is slidably moved in a direction indicated with an arrow, i.e., in a direction of approaching the module slot, in such a way that the locking pieces 46RF and 46LF come into engagement with the pressing springs 226S1 and 227S1. Thus, as shown in FIG.

13C, the heatsink 46 is fixed to the upper end of the side wall 226 and to the top plate 127 in a state where the contacting end portion 46EF is in contact with a locking piece 222T. On the other hand, to detach the heatsink 46 from the receptacle cage 23, the entire heatsink 46 is once slidably moved in a direction opposite from the direction indicated with the arrow shown in FIG. 13B. Then, the locking pieces 46RF and 46LF of the heatsink 46 are detached upward through the spaces between the pressing springs 226S1 on the same row and the spaces between the pressing springs 227S1 on the same row, respectively. Thus, the heatsink 46 is detached from the receptacle cage 23.

Figure 14A:
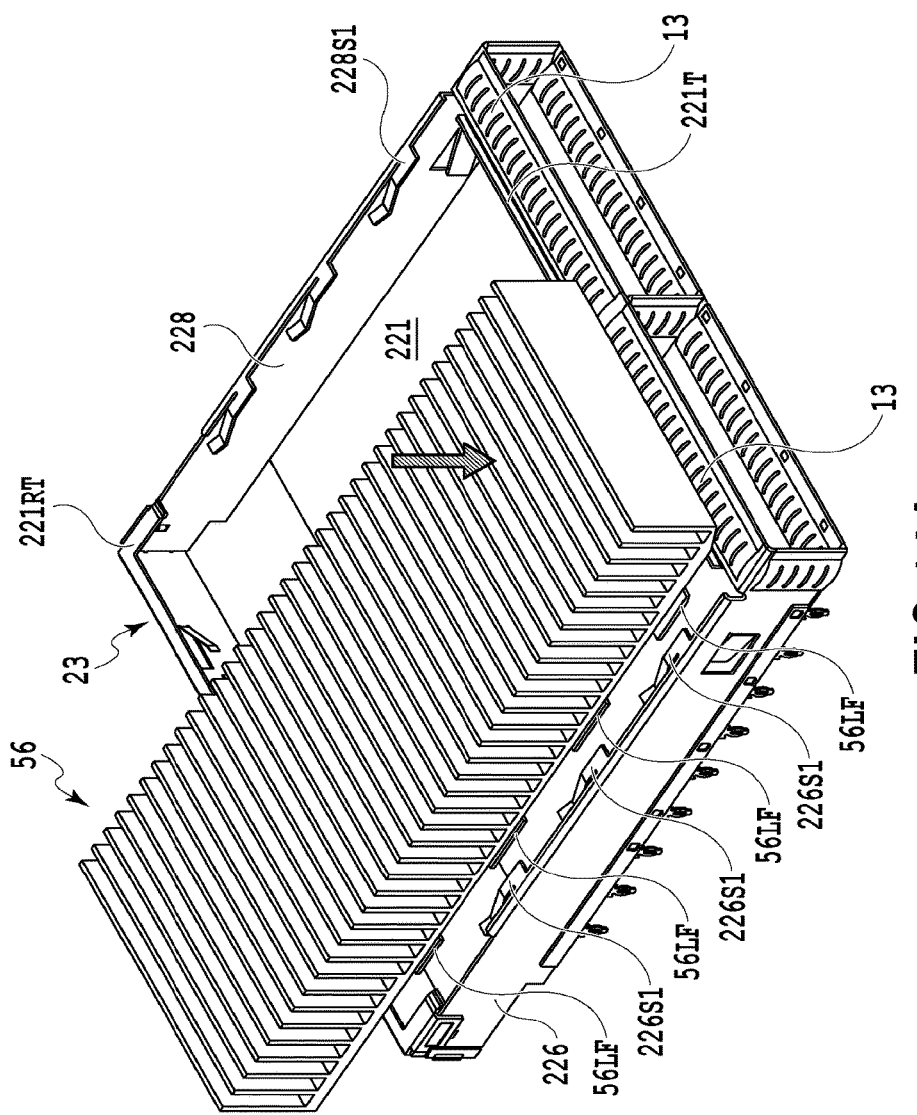
FIG. 14A is a perspective view made available for explanation of an operation to attach the other example of the heatsink in the example illustrated in FIG. 11.
Figure 14B:
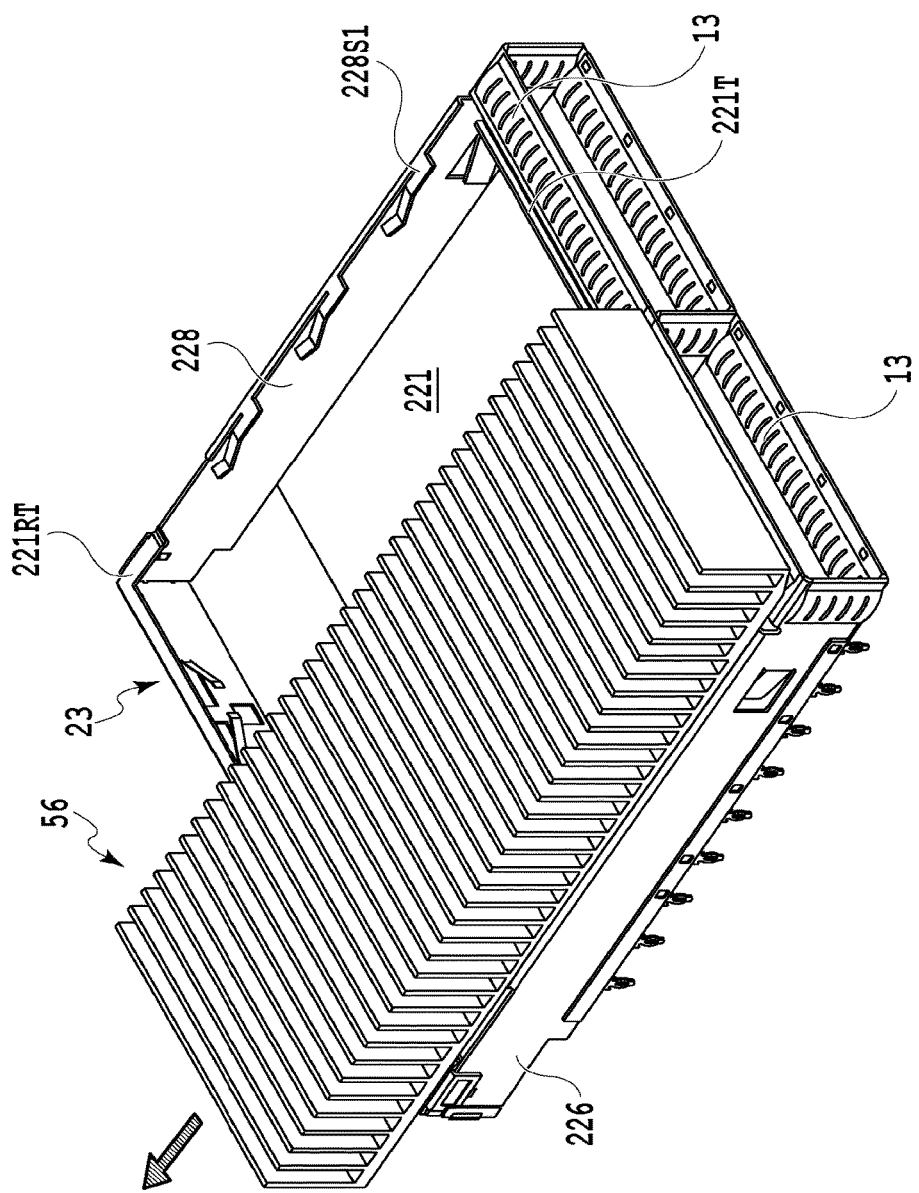
FIG. 14B is a perspective view made available for explanation of an operation to attach the other example of the heatsink in the example illustrated in FIG. 11.
Figure 14C:
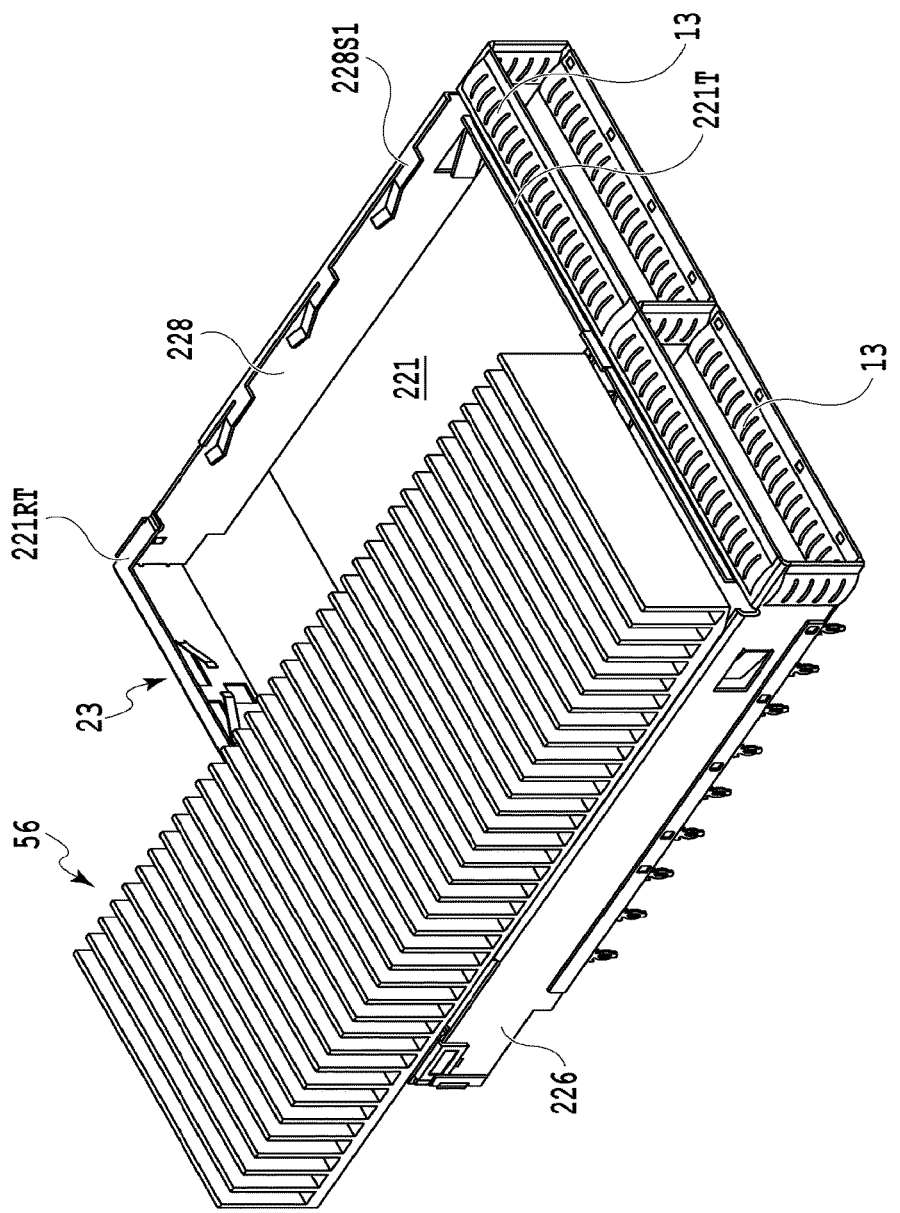
FIG. 14C is a perspective view made available for explanation of an operation to attach the other example of the heatsink in the example illustrated in FIG. 11.

In the meantime, attachment operations to fix the respective heatsinks 56 from positions immediately above to the compartments of the receptacle cage 23 as shown in FIG. 14A to FIG. 14C are operations that are similar to one another. Accordingly, an attachment operation concerning the compartment 222 will be representatively described below and explanation of the attachment operation concerning the other compartment will be omitted.

First, the locking pieces 56RF and 56LF of the heatsink 56 are located above the compartment 222 of the receptacle cage 23 in such a way as to be opposed to the spaces between the pressing springs 226S1 on the same row and the spaces between the pressing springs 227S1 on the same row, respectively. Next, the base portion 56M of the heatsink 56 is inserted into the compartment 222 through the opening of the compartment 222 of the receptacle cage 23, and the heatsink 56 is placed on the upper end of the side wall 226 and on the top plate 127 as shown in FIG. 14B. Subsequently, the entire heatsink 56 is slidably moved in a direction indicated with an arrow, i.e., in a direction of receding from the module slot, in such a way that the locking pieces 56RF and 56LF come into engagement with the pressing springs 226S1 and 227S1. Thus, as shown in FIG. 14C, the heatsink 56 is fixed to the upper end of the side wall 226 and to the top plate 127. On the other hand, to detach the heatsink 56 from the receptacle cage 23, the entire heatsink 56 is once slidably moved in a direction opposite from the direction indicated with the arrow shown in FIG. 14B. Then, the locking pieces 56RF and 56LF of the heatsink 56 are detached upward through the spaces between the pressing springs 226S1 on the same row and the spaces between the pressing springs 227S1 on the same row, respectively. Thus, the heatsink 56 is detached from the receptacle cage 23.

Figure 15:
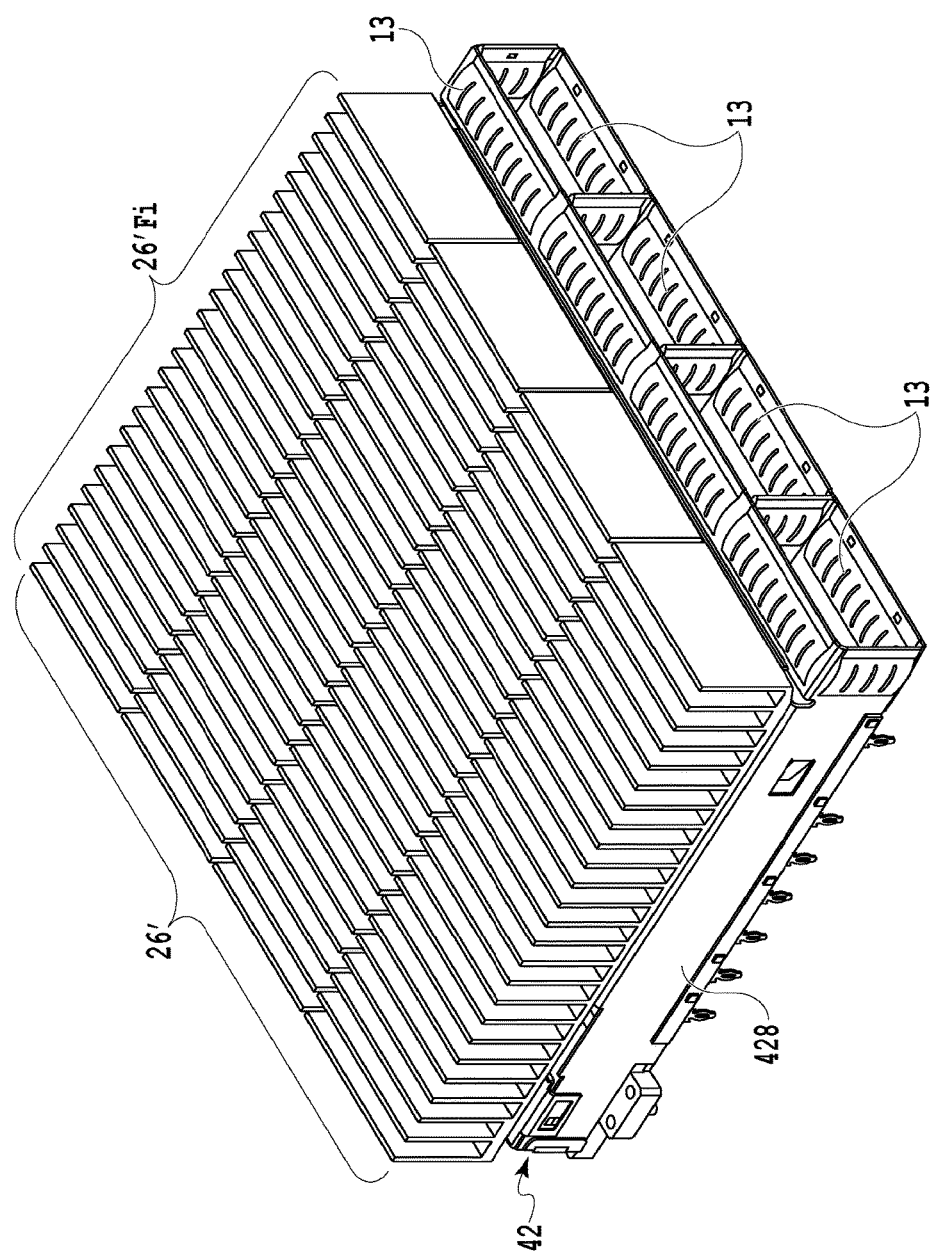
FIG. 15 is a perspective view showing a heatsink and a receptacle cage used in a fourth embodiment of the receptacle assembly according to the present invention.
Figure 16:
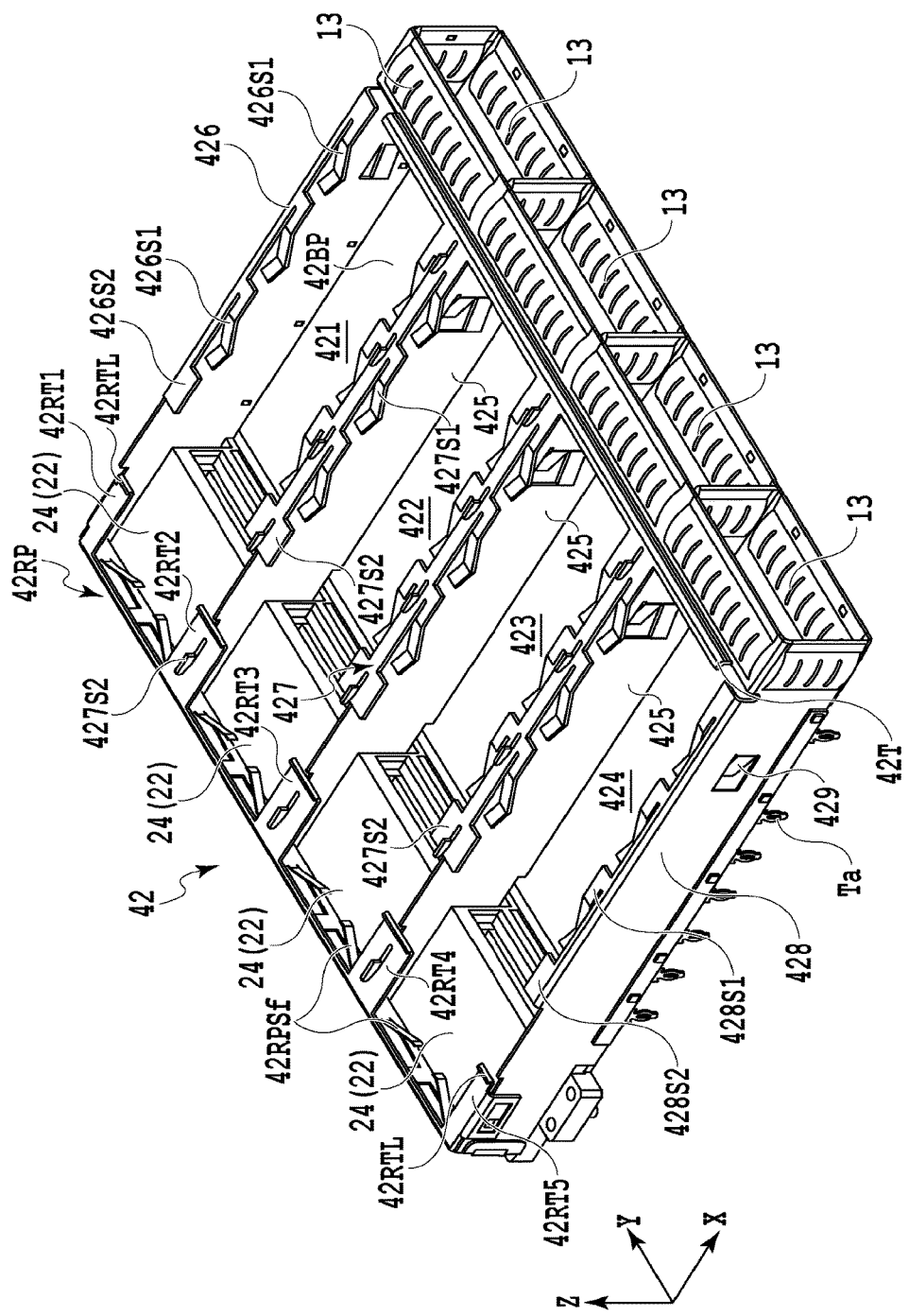
FIG. 16 is a perspective view showing a receptacle cage used in the example illustrated in FIG. 15.

FIG. 16 shows a receptacle cage used in a fourth embodiment of the receptacle assembly constituting part of the transceiver module assembly according to the present invention. FIG. 16 illustrates a state where a plurality of optical modules 14 and a plurality of heatsinks 26' (see FIG. 15) to be described later are detached therefrom.

The transceiver module assembly comprises the above-mentioned optical modules 14 and an optical module receptacle assembly.

The optical module receptacle assembly comprises, as its main constituents: receptacle cages 42 provided on the above-described printed wiring board 16 and detachably housing the above-described optical modules 14; receptacle connectors 22 accommodated in receptacle connector accommodating portions of the receptacle cages; and a cover 24 including a plurality of connector accommodating portions to separately accommodate the receptacle connectors.

As shown in FIG. 16, each receptacle cage 42 is made of a thin plate of stainless steel or phosphor bronze, for example, and is preferably formed by press working of stainless steel or phosphor bronze having high thermal conductivity. Compartments 421, 422, 423, and 424, each of which is formed from a module accommodating portion and the receptacle connector accommodating portion, are provided inside the receptacle cages 42. The compartments 421, 422, 423, and 424 are arranged in parallel along a Y coordinate axis of the Cartesian coordinates in FIG. 16, which extends in a direction orthogonal to a direction of attachment and detachment of the optical modules 14. Since the compartments 421, 422, 423, and 424 have the same structure, the compartment 421 will be described below while omitting explanation of the rest of the compartments 422, 423, and 424.

The module accommodating portion of the compartment 421 is formed by being surrounded by a side wall 426 and a partition wall 425 opposed to each other with a predetermined interval in between, as well as a bottom wall portion 42BP of the module accommodating portion. The side wall 426 and the partition wall 425 extend in an X coordinate axis in FIG. 16, i.e., along the direction of attachment and detachment of the optical module 14. Each of the side wall 426 and the partition wall 425 is provided with a lock piece 429 located in the vicinity of a module slot to be described later. The lock pieces 429 on the side wall 426 and the partition wall 425 are opposed to each other. Each lock piece 429 is selectively engaged with a locking piece of a release plate of the optical module 14 so as to establish a locked state of the above-described optical module 14 with the module accommodating portion.

The module accommodating portion has the module slot on one end, which is opened in the direction of the X coordinate axis. Accordingly, the optical module 14 is attached and detached via the module slot. Tubular front EMI fingers 13 are provided at the entire periphery of the module slot having a substantially rectangular cross section. The front EMI fingers 13 constitute a shield member. An inner peripheral portion of each front EMI finger 13 comes into contact with an outer peripheral portion of the inserted optical module 14. In addition, an outer peripheral portion of each front EMI finger 13 comes into contact with a peripheral edge of an opening of the casing described above, for example. Accordingly, when the receptacle cage 42 is press-fitted into the opening of the casing, a gap between the opening of the casing and an outer peripheral portion of the receptacle cage 42 is shielded with the shield member including the front EMI fingers made of a metal. Thus, noise is confined in the above-described casing, and there is no risk of leakage of the noise to the outside through a gap between the outer peripheral portion of the optical module 14 and an inner peripheral portion of the module accommodating portion.

In the meantime, the other end of the module accommodating portion opposite from the module slot communicates with the inside of the receptacle connector accommodating portion. An opening opened along a Z coordinate axis in FIG. 16 is formed at a portion of the receptacle cage 42 opposite from the bottom wall portion 42BP. A heatsink support mechanism which detachably supports the heatsink 26' to be described later is provided on a peripheral edge of the opening. Here, the heatsink support mechanism which detachably supports the heatsink 26' is also provided to each of the compartments 422, 423, and 424. Accordingly, the respective heatsinks 26' are selectively disposed on the receptacle cages 42 via the heatsink support mechanisms in such a way as to block the above-mentioned openings of the compartments 421, 422, and 423 as well as of the compartment 424.

The heatsink 26' is made of a metal having high thermal conductivity such as aluminum. The heatsink 26' has a plurality of fins 26'Fi (i=1 to n, n is a positive integer) which are arranged in parallel with one another and at predetermined intervals along the X coordinate axis. The plurality of fins 26'Fi are formed substantially perpendicular to a flat surface of a base portion 26'M to be supported by the heatsink support mechanism. A locking end portion 26'EF is formed at one end in a longitudinal direction of the base portion 26'M. In addition, an extension portion 26'ER is formed at the other end in the longitudinal direction of the base portion 26'M. At the time of attachment of the heatsink 26', an end surface of the extension portion 26'ER is locked with a fixing portion of a guide plate 42RP to be described later. A pair of flange portions 26'FF each having a predetermined length and being opposed to a lower end surface 26'B of a junction, where lower end portions of the plurality of fins 26'Fi are joined together, are integrally formed on two side surfaces of the base portion 26'M along the longitudinal direction of the base portion 26'M. Each of the pair of flange portions 26'FF projects laterally. An elongated groove is formed between the lower end surface 26'B and each of the above-mentioned flange portions 26'FF. Peripheral edges of the elongated grooves are slidably engaged with: a flexural piece 426S2 and three pressing springs 426S1 which are formed at an upper end portion of the side wall 426; and a flexural piece 427S2 and three pressing springs 427S1 of a top plate 427 provided at an upper end of the partition wall 425. When the optical module 14 is attached to the inside of the receptacle cage 42, a heat transfer surface of the base portion 26'M inclusive of the extension portion 26'ER comes into contact with an upper plate of the optical module 14 and a surface of a protection wall portion 143. As a consequence, heat from the optical module 14 is dissipated via the heatsink 26'. In this case, a heat transfer area is expanded more by bringing the heat transfer surface of the extension portion 26'ER into contact with the surface of the protection wall portion 143. Thus, the optical module 14 can be cooled more efficiently. In addition, strength of the heatsink 26' is improved by the extension portion 26'ER.

As shown in FIG. 16, the above-mentioned heatsink support mechanism comprises: the flexural piece 426S2 and the three pressing springs 426S1 formed at a flexural portion provided at an uppermost end of the side wall 426 constituting the receptacle cage 42; the flexural piece 427S2 and the three pressing springs 427S1 formed at the top plate 427 provided at the upper end of each of the partition walls 425; and a flexural piece 428S2 and three pressing springs 428S1 formed at a flexural portion provided at an uppermost end of a side wall 428.

The pressing springs 426S1 as well as the flexural piece 426S2 of the side wall 426 and the top plate 427 provided at the upper end of the partition wall 425 are formed on a common plane in such a way as to face one another with a predetermined interval in between. Ends on one side of the side walls 426 and 428 and ends on one side of the respective partition walls 425 are connected to one another by the guide plate 42RP which extends along the Y coordinate axis in FIG. 16.

The guide plate 42RP comprises: a cover fixation unit coming into contact with the ends on the one side of the side walls 426 and 428 as well as the ends on the one side of the respective partition walls 425 and constituting a back surface portion of the receptacle cage 42; and guide pieces 42RT1, 42RT2, 42RT3, 42RT4, and 42RT5 formed continuously with an upper end portion of the cover fixation unit.

Two ends in a longitudinal direction of the cover fixation unit are locked with outer peripheral portions of the side walls 426 and 428, respectively. Pairs of ejection plate springs 42RPSf are formed on a common straight line at the cover fixation unit. The pairs of the ejection plate springs 42RPSf are formed corresponding to the compartments 421, 422, 423, and 424, respectively. A rectangular opening, into which a claw portion of the cover 24 is inserted, is formed at a position below each pair of the ejection plate springs 42RPSf. In this way, the cover 24 is fixed to the guide plate 42RP. Each pair of ejection plate springs 42RPSf are configured to bias the protection wall portion 143 of each attached optical module 14 in such a way as to push outward just in a predetermined amount from the receptacle cage 42 through the module slot.

Figure 17A:
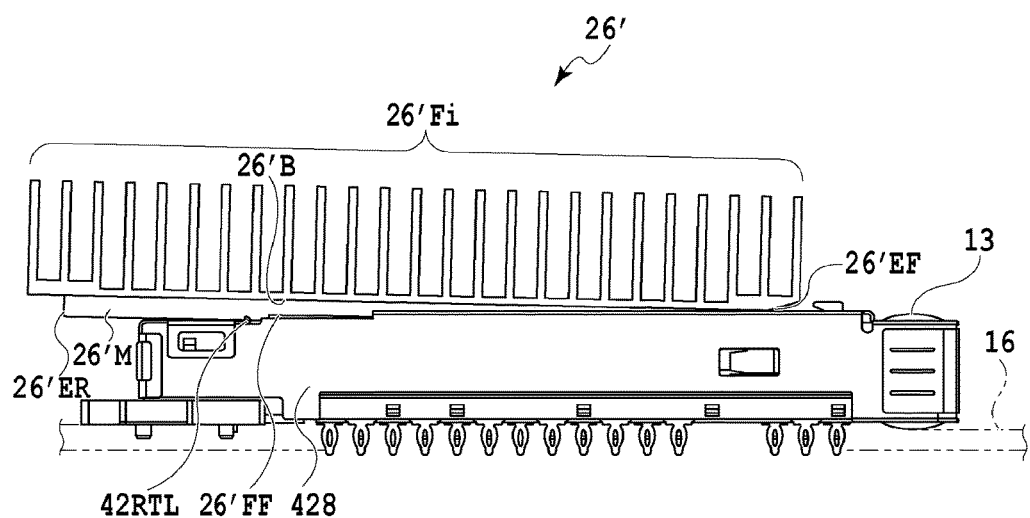
FIG. 17A is a view made available for explanation of an operation to attach the example of the heatsink in the example illustrated in FIG. 15.

The guide pieces 42RT1 to 42RT5 are placed on and locked with upper parts of the ends on the one side of the side walls 426 and 428 and upper parts of the ends on the one side of the respective partition walls 425. The guide pieces 42RT1 to 42RT5 are formed in parallel with one another, and extend at a predetermined distance toward the flexural pieces 426S2, 427S2, and 428S2, respectively. Tip end portions of the guide pieces 42RT1 to 42RT5 are formed at positions away from end portions of the flexural piece 426S2, the flexural pieces 427S7, and the flexural piece 428S2, respectively. A guide end 42RTL that is partially folded upward is provided at the tip end portion of each of the guide pieces 42RT1 to 42RT5. Thus, as shown in FIG. 17A, the flexural piece 426S2, the flexural pieces 427S2, and the flexural piece 428S2 can easily be inserted into the elongated grooves of the heatsinks 26', respectively, in the state where the locking end portions 26'EF are tilted obliquely downward to the right toward the inside of the module accommodating portions. In this case, the flange portions 26'FF are brought into slidable contact with the guide ends 42RTL at the tip end portions of the guide pieces 42RT1 to 42RT5, respectively.

In the meantime, the guide pieces 42RT2 to 42RT4 project into the adjacent compartments, respectively.

Figure 17B:
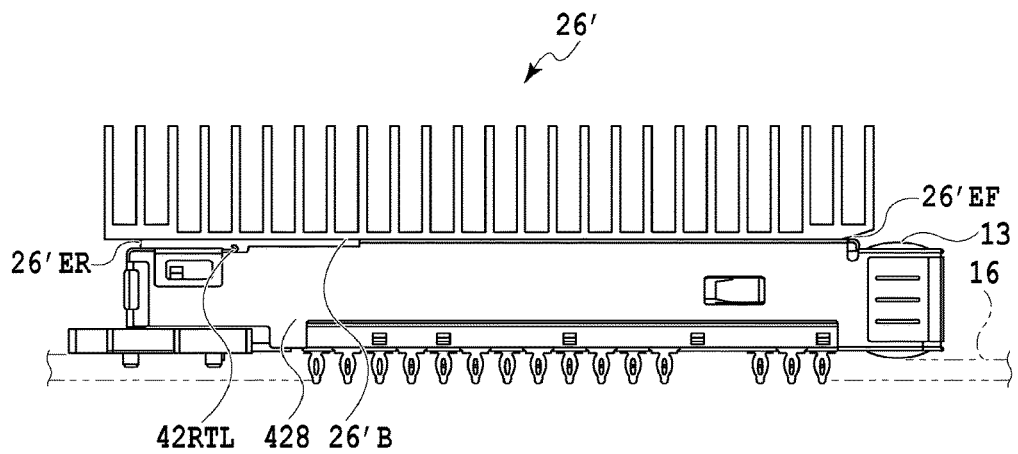
FIG. 17B is a view made available for explanation of an operation to attach the example of the heatsink in the example illustrated in FIG. 15.

The extension portions 26'ER of the heatsinks 26' described above are inserted between the guide piece 42RT1 and the guide piece 42RT2, between the guide piece 42RT2 and the guide piece 42RT3, between the guide piece 42RT3 and the guide piece 42RT4, and between the guide piece 42RT4 and the guide piece 42RT5. Portions between the ends of the guide piece 42RT1 and the guide piece 42RT2, between the ends of the guide piece 42RT2 and the guide piece 42RT3, between the ends of the guide piece 42RT3 and the guide piece 42RT4, and between the ends of the guide piece 42RT4 and the guide piece 42RT5 are formed as fixing portions, with which the end surfaces of the extension portions 26ER of the above-mentioned heatsinks 26' placed into spaces between the above-described guide pieces are locked, respectively as shown in FIG. 17B.

A flexural portion formed integrally with the guide piece 42RT1, and a flexural portion formed integrally with the guide piece 42RT5 are locked with the outer peripheral portions of the side walls 426 and 428, respectively.

As with the example shown in FIG. 7A, a position of each of the guide pieces 42RT1 to 42RT5 is set to such a position lower by a predetermined dimension than a position of the corresponding top plate 427. In addition, a distance between an inner peripheral portion of each of the guide pieces 42RT1 to 42RT5 and an upper surface of an outer peripheral portion of the cover 24 is set larger than a thickness of the protection wall portion 143 of the optical module 14. In addition, the distance is set such that a clearance between an upper surface of the protection wall 143 and an inner peripheral surface of the guide piece 42RT1 becomes larger than a clearance between a slit of the cover 24 and the plug connector 146 when the protection wall 143 is inserted between the guide piece 42RT1 and the upper surface of the outer peripheral portion of the cover 24.

The pressing springs 426S1 to bias one of the flange portions 26'FF of the heatsink 26' downward are formed at three positions at predetermined intervals on a common straight line at the flexural portion of the side wall 426. A base end of each pressing spring 426S1 is formed integrally with the flexural portion of the side wall 426. A tail end of each pressing spring 426S1 extends toward the flexural piece 426S2 and has a folded portion which is elastically deformable along the Z coordinate axis.

The pressing springs 427S1 to bias the other flange portion 26'FF of the heatsink 26' are formed at three positions at predetermined intervals on a common straight line at each top plate 427 as well. A base end of each pressing spring 427S1 is formed integrally with the top plate 427. A tail end of each pressing spring 427S1 extends toward the flexural piece 427S2 and has a folded portion which is elastically deformable along the Z coordinate axis. Thus, if the heatsink 26' is not attached, the optical module 14 does not interfere with the pressing springs 426S1 or the pressing springs 427S1 and the folded portions are kept from buckling even when the optical module 14 is inserted.

Ends on the other side of the side wall 426 and the partition walls 425 and an end on the other side of the side wall 428 are connected to one another by a junction where the front EMI fingers 13 that form the peripheral edges of the module slots are provided. A locking piece 42T to lock the locking end portions 26'EF of the heatsinks 26' is integrally formed at a portion of the junction opposed to the fixing portions of the guide plate 42RP.

An end portion of the bottom wall portion 42BP, which connects lower ends of the side wall 426 and of the partition wall 425, is in contact with a mounting surface of the printed wiring board 16. Moreover, the end portion of the bottom wall portion 42BP is in contact with one side of an annular grounding contact pad to be formed on the mounting surface of the printed wiring board 16. Thus, the receptacle cage 42 is grounded.

A plurality of press-fitting claw portions Ta are formed at predetermined intervals on the lower ends of the side wall 426, the partition walls 425, and the side wall 428, respectively. The press-fitting claw portions Ta are press-fitted, respectively, into small holes formed in a surface of the printed wiring board 16 in such a way as to correspond to arrays of the press-fitting claw portions Ta. Thus, a lower end surface of the receptacle cage 12 is closely attached and fixed to the surface of the printed wiring board 16.

The receptacle connector accommodating portion, which is opened toward the surface of the printed wiring board 16, is formed by being surrounded by a receptacle connector-side closed end portion opposed to the module slot of the receptacle cage 42, and receptacle connector-side portions of the side wall 426 and the partition wall 425.

A plurality of flange portions for attaching the receptacle cage 42 onto the mounting surface of the printed wiring board 16 with screws are provided at outer peripheral portions of side surfaces and a back surface of the receptacle cage 42, respectively.

In the above-described configuration, attachment operations to fix the respective heatsinks 26' from the guide plate 42RP side to the compartments of the receptacle cage 42 are operations that are similar to one another. Accordingly, an attachment operation concerning the compartment 421 will be representatively described below and explanation of the attachment operations concerning the rest of the compartments will be omitted.

First, the position of the heatsink 26' is tilted with respect to the module accommodating portion such that the flexural piece 426S2 and the flexural piece 427S2 are inserted into open ends of the elongated grooves of the heatsink 26' through the opening of the receptacle cage 42, respectively. Next, the flange portions 26'FF are brought into slidable contact with the guide ends 42RTL at the tip end portions of the guide pieces 42RT1 to 42RT5 such that the respective pressing springs 426S1 and the respective pressing springs 427S1 are inserted into the elongated grooves of the heatsink 26'. In the meantime, the heatsink 26' is further slidably moved along the above-mentioned direction of insertion in the state where the folded pieces of the respective pressing springs 426S1 and of the respective pressing springs 427S1 are pushed upward. Subsequently, ends of the flange portions 26'FF are detached from the guide ends 42RTL at the tip end portions of the guide pieces 42RT1 to 42RT5, and the locking end portion 26'EF in a traveling direction of the heatsink 26' comes into contact with the locking piece 42T. Thereafter, as shown in FIG. 17B, the extension portion 26'ER of the heatsink 26' is placed into the above-mentioned space between the guide pieces, and the end surface of the extension portion 26'ER is locked with the above-mentioned fixing portion. Thus, the lower end surface 26'B of the heatsink 26' is placed in a substantially horizontal state on the side wall 426 and on an upper surface of the top plate 427. At this time, the heatsink 26' is locked with the receptacle cage 42 because biasing force of the respective pressing springs 426S1 and the respective pressing springs 427S1 acts on the flange portions 26'EF of the heatsink 26'. Hence, the attachment of the heatsink 26' is completed as shown in FIG. 15 and FIG. 17B. Accordingly, since the downward force is applied from the respective pressing springs 426S1 and the respective pressing springs 427S1 to the heatsink 26', the heatsink 26' does not run over a rear end of the receptacle cage 42. In other words, no lock springs are required.

On the other hand, to bring the heatsink 26' into an unlocked state with respect to the receptacle cage 42 and to detach the heatsink 26' from the receptacle cage 42, the extension portion 26'ER of the heatsink 26' is first pulled immediately upward. Then, the heatsink 26' is set to an oblique position and pulled out in a direction to detach the locking end portion 26'EF from the locking piece 42T. Thus, the heatsink 26' is detached from the receptacle cage 42.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A receptacle assembly provided with a heatsink, comprising:
a receptacle cage including
at least one module accommodating portion provided with at least one module slot located on one end of the module accommodating portion, the module slot configured to allow passage of an optical module, the optical module having a module board provided with a connection end portion at one end portion of the module board, the module accommodating portion configured to detachably accommodate the optical module, and having a bottom wall portion to come into contact with a lower surface of the optical module, and at least one connector accommodating portion communicating with the module accommodating portion and configured to accommodate a connector to which the connection end portion of the module board is detachably connected;

the heatsink selectively placed on the receptacle cage, and having elongated grooves and lock pieces which are formed at predetermined intervals on both side portions of a base portion of the heatsink and configured to dissipate heat generated from the optical module by coming into contact with an outer peripheral portion of the optical module via a heat transfer surface having an area corresponding to an area of the bottom wall portion;

a heatsink support mechanism provided at the receptacle cage, and having pressing springs which are inserted through the elongated grooves of the heatsink and are slidably engaged with the lockpieces, and configured to support the heatsink slidably along a direction of attachment and detachment of the optical module when the heatsink is placed on the receptacle cage using the elongated grooves; and a guide plate member which is integrally formed with the receptacle cage, the guide plate member having guide pieces formed continuously with an upper end portion of a cover fixation portion provided at the receptacle cage and configured, when the heatsink is not disposed, to come into contact with an upper surface of a tip end portion of a protection wall of the optical module, which projects toward the connector more than the connection end portion of the optical module, and thus to deflect the tip end portion of the protection wall a predetermined distance into the connector accommodating portion, in such a way as to guide a tip end portion of the connection end portion of the optical module, being inserted through the module slot, to the connector.

2. The receptacle assembly provided with the heatsink according to claim 1, wherein the guide plate member has a notch portion located at a position above the connector accommodating portion, and the heat transfer surface of the heatsink has an extension portion to be inserted into the notch portion.

3. The receptacle assembly provided with the heatsink according to claim 1, wherein the guide plate member is fixed to a side wall of the receptacle cage.

4. The receptacle assembly provided with the heatsink according to claim 1, wherein a clearance is formed between an inner peripheral surface of the guide plate member and an outer peripheral surface of a connector cover covering the connector, in such a way as to allow insertion of a protection wall of the optical module configured to protect the connection end portion.

5. The receptacle assembly provided with the heatsink according to claim 1, wherein the guide plate member is provided at a lower position than a position of the heatsink support mechanism in the receptacle cage.

6. The receptacle assembly provided with the heatsink according to claim 2, wherein a width of the notch portion of the guide plate member in a direction orthogonal to the direction of attachment and detachment of the optical module is smaller than a width, being orthogonal to the direction of attachment and detachment, of a protection wall of the optical module.

7. The receptacle assembly according to claim 1, wherein, when the heatsink is placed on the receptacle cage, an end portion of the heatsink is fixed with the guide plate member in a state of being biased by an elastic member of the heatsink support mechanism.

8. A transceiver module assembly comprising:

the optical module including the module board provided with & the connection end portion at one end portion of the module board; and the receptacle assembly according to claim 1.

* * * * *